United States Patent
Chen et al.

(10) Patent No.: US 11,756,933 B2
(45) Date of Patent: Sep. 12, 2023

(54) INACTIVE STRUCTURE ON SOIC

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/174,671

(22) Filed: Feb. 12, 2021

(65) Prior Publication Data

US 2022/0262768 A1  Aug. 18, 2022

(51) Int. Cl.
*H01L 25/065* (2023.01)
*H01L 25/00* (2006.01)
*H01L 25/04* (2023.01)
*H01L 25/07* (2006.01)
*H01L 23/00* (2006.01)
*H01L 23/367* (2006.01)
*H01L 21/78* (2006.01)

(52) U.S. Cl.
CPC .......... *H01L 25/0657* (2013.01); *H01L 21/78* (2013.01); *H01L 23/367* (2013.01); *H01L 23/562* (2013.01); *H01L 24/08* (2013.01); *H01L 24/89* (2013.01); *H01L 25/50* (2013.01); *H01L 2224/08145* (2013.01); *H01L 2224/80895* (2013.01); *H01L 2224/80896* (2013.01)

(58) Field of Classification Search
CPC . H01L 25/50; H01L 25/0657; H01L 2924/00; H01L 2924/3511
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,153,222 B2* | 12/2018 | Yu | H01L 21/486 |
| 10,510,668 B1 | 12/2019 | Chen et al. | |
| 2011/0026232 A1 | 2/2011 | Lin et al. | |
| 2016/0322330 A1* | 11/2016 | Lin | H01L 25/0652 |

(Continued)

FOREIGN PATENT DOCUMENTS

TW  201737447 A  10/2017

*Primary Examiner* — Anthony Ho
*Assistant Examiner* — David J Goodwin
(74) *Attorney, Agent, or Firm* — Slater Matsil, LLP

(57) ABSTRACT

A package device includes a first device die and second device die bonded thereto. When the area of the second device die is less than half the area of the first device die, one or more inactive structures having a semiconductor substrate is also bonded to the first device die so that the combined area of the second device die and the one or more inactive structures is greater than half the area of the first device die.

20 Claims, 37 Drawing Sheets

(56) References Cited

U.S. PATENT DOCUMENTS

| | | | |
|---|---|---|---|
| 2017/0092626 A1* | 3/2017 | Yuan | H01L 21/76898 |
| 2018/0138101 A1* | 5/2018 | Yu | H01L 23/3114 |
| 2019/0148351 A1* | 5/2019 | Chen | H01L 21/76898 |
| | | | 257/678 |
| 2021/0125968 A1 | 4/2021 | Yu et al. | |

* cited by examiner

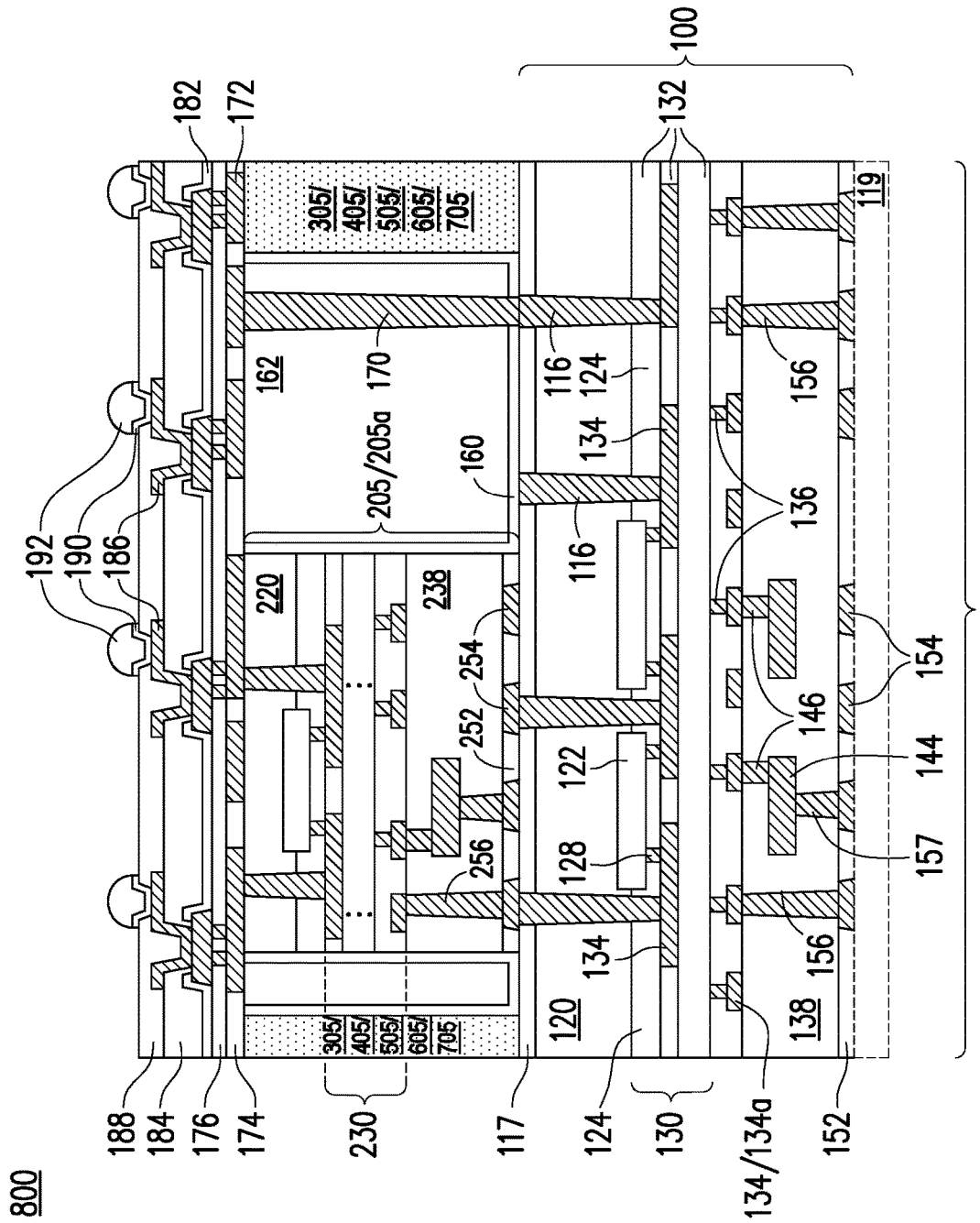

INACTIVE STRUCTURE ON SOIC

BACKGROUND

The packages of integrated circuits are becoming increasing complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 29 through 37 illustrate a package device having a first device die, one or more device dies attached thereto, and one or more inactive structures also attached thereto, in accordance with various embodiments.

DETAILED DESCRIPTION

Figure 1:
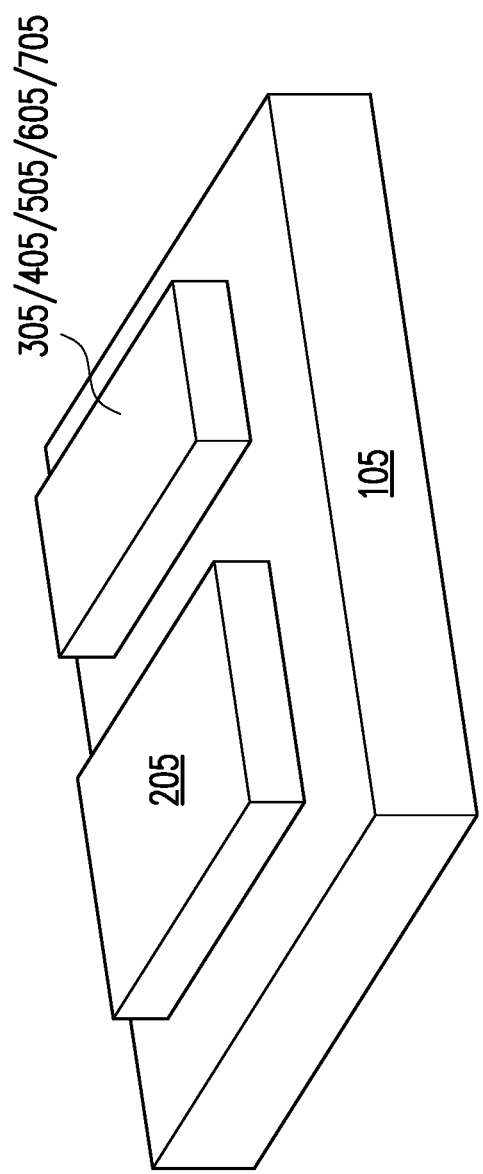
FIG. 1 illustrates a perspective view of a package device in an intermediate step in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A System on Integrate Chip (SoIC) package and the method of forming the same are provided in accordance with various embodiments. The intermediate stages of forming the SoIC package are illustrated in accordance with some embodiments. Some variations of some embodiments are discussed. Throughout the various views and illustrative embodiments, like reference numbers are used to designate like elements. It is appreciated that although the formation of SoIC packages is used as examples to explain the concept of the embodiments of the present disclosure, the embodiments of the present disclosure are readily applicable to other bonding methods and structures in which metal pads and vias are bonded to each other.

FIG. 1 illustrates a perspective view of an SoIC package device in an intermediate step in accordance with some embodiments. While some examples of types of device dies 105 and 205 are listed below, the device dies 105 and 205 may be any dies. The device die 105 may be a logic die, such as a Central Processing Unit (CPU) die, a Micro Control Unit (MCU) die, an input-output (IO) die, a BaseBand (BB) die, an Application processor (AP) die, or the like. The device die 105 may also be a memory die such as a Dynamic Random Access Memory (DRAM) die or a Static Random Access Memory (SRAM) die, or the like. The device die 105 may be part of a wafer (see FIG. 2). The device die 205 is electrically bonded to the device die 105. The device die 205 may be a logic die, which may be a CPU die, MCU die, IO die, Base-Band die, or AP die. The device die 205 may also be a memory die. Multiple device dies 205 may be bonded to the device die 105, each one having different functionality.

The inactive structure 305/405/505/605/705 is bonded to the device die 105 and may be used to support a dielectric layer used as gap fill material of the package device 800 (see, e.g., gap fill dielectric layer 162 of FIG. 28) by reducing the total thermal expansion mismatch and thereby reducing warpage. The inactive structures 305, 405, 505, 605, and 705 are described in detail below. The inactive structures 305, 405, 505, and 605 are each dummy structures which provide no electrical function (i.e., are electrically isolated from active devices of the device die 105) in the final package, but which provide structural support and may provide thermal dissipation properties in some embodiments. In addition to structural support and thermal dissipation, the inactive structures 705 may, however, also include electrical function by way of through vias, as discussed in greater detail below.

In some embodiments, multiples of the inactive structure 305/405/505/605/705 may be used in various combinations of the inactive structure 305, the inactive structure 405, the inactive structure 505, the inactive structure 605, and the inactive structure 705. In some embodiments, the material used for forming the gap fill dielectric layer 162 which laterally surrounds the device dies 205 and inactive structures 305/405/505/605/705 (see, e.g., FIG. 28) is the same material as the dielectric material (e.g., oxide) used for bonding the inactive structures 305/405/505/605/705 and the device dies 205 to the device die 105. In another embodiment, the gap fill dielectric layer 162 is a passivation or protection dielectric used to encapsulate the inactive structures 305/405/505/605/705 and the device dies 205.

Figure 2:
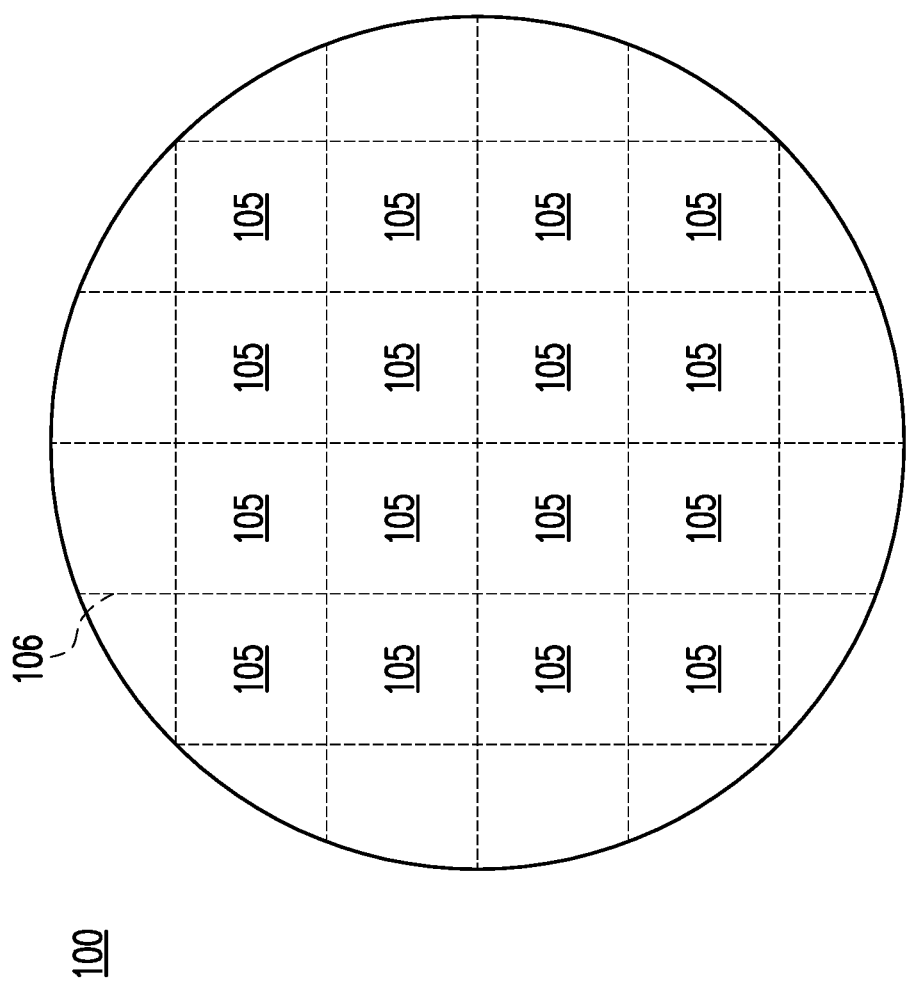
FIG. 2 illustrates a top down view of a package component with multiple device dies defined within.

FIG. 2 illustrates a package component 100 (which may be a wafer, as illustrated) with multiple device dies 105 defined within. The device dies 105 may all be of the same design and function or may be of different designs and functions. The dashed lines represent dicing lines 106 where the device dies 105 will be separated from each other in a subsequent singulation process.

Figure 3:
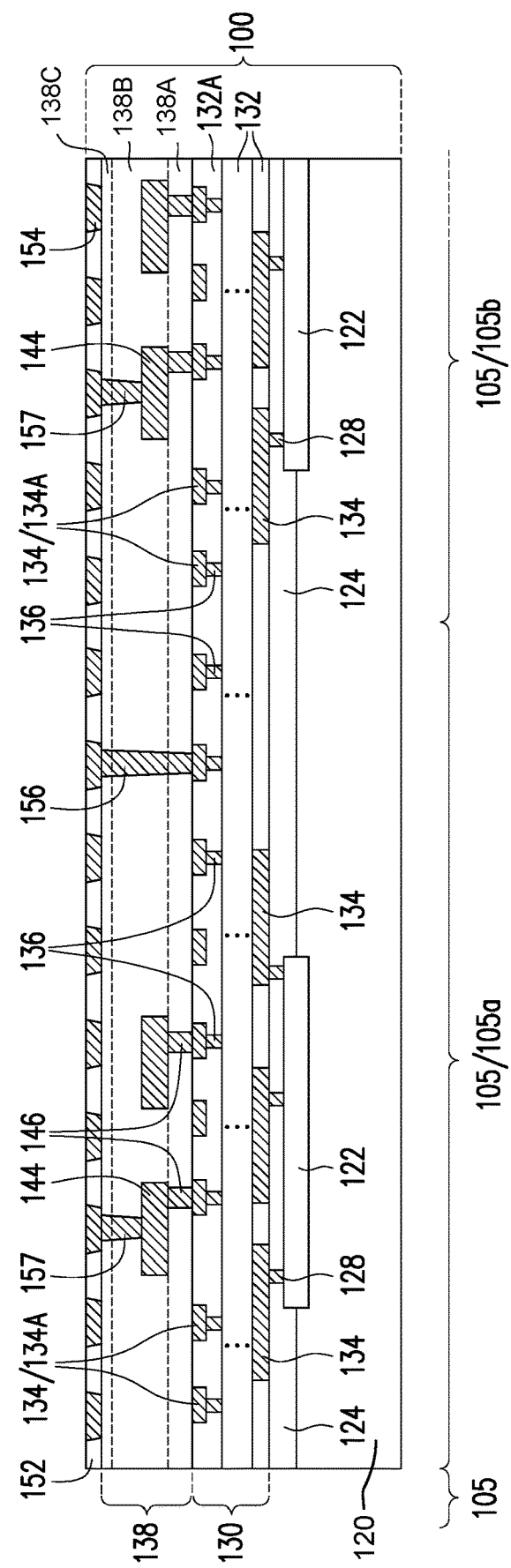
FIGS. 3 through 6 illustrate cross-sectional views of intermediate stages in the formation of a package device in accordance with some embodiments of the present disclosure.
Figure 4:
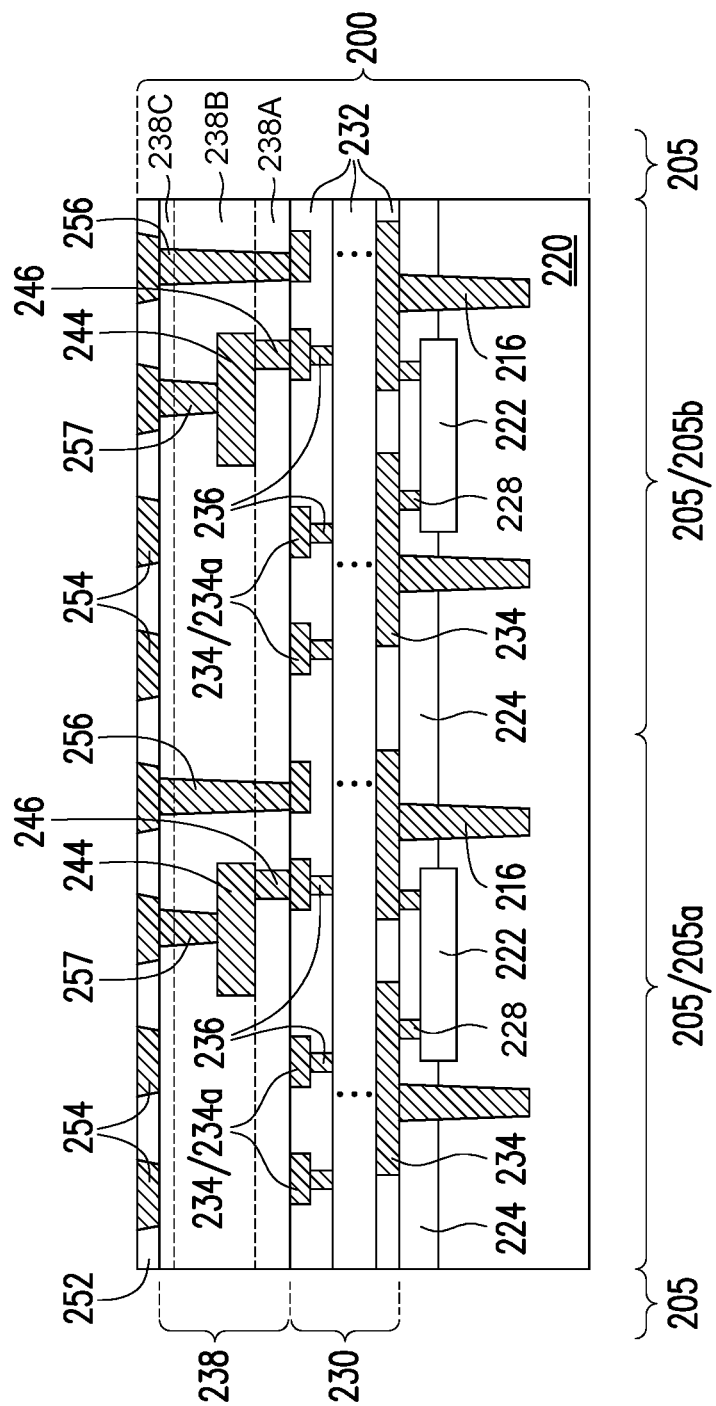
Figure 5:
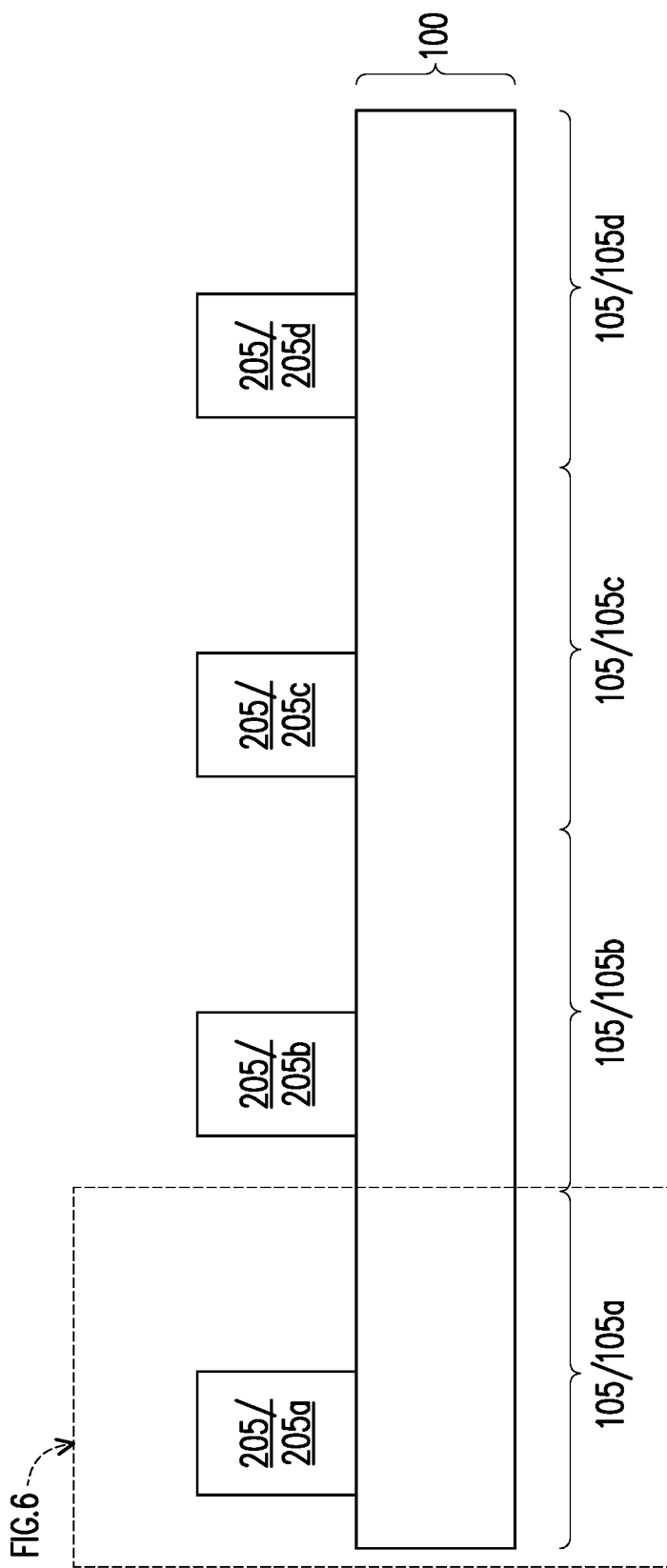

FIGS. 3 through 5 illustrate cross-sectional views of intermediate stages in the formation of an SoIC package in accordance with some embodiments of the present disclosure. FIG. 3 illustrates the cross-sectional view in the formation of package component 100. In accordance with some embodiments of the present disclosure, package component 100 is a portion of a device wafer including integrated circuit devices 122, e.g., active devices such as transistors and/or diodes, and possibly passive devices such as capacitors, inductors, resistors, or the like. Package component 100 may include a plurality of device dies 105 therein, with a portion of device die 105a and a portion of device die 105b illustrated. It should be understood that these views are merely illustrative and not limiting.

In accordance with other embodiments of the present disclosure, package component 100 includes passive devices (with no active devices). In some embodiments, and as referenced in the discussion below, package component 100 may be a device wafer. The embodiments of the present disclosure may also be applied to other types of package components such as interposer wafers.

In accordance with some embodiments of the present disclosure, the wafer 100 includes semiconductor substrate 120 and the features formed at a top surface of semiconductor substrate 120. Semiconductor substrate 120 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 120 may also be a bulk silicon substrate or a Silicon-On-Insulator (SOI) substrate. Shallow Trench Isolation (STI) regions (not shown) may be formed in semiconductor substrate 120 to isolate the active regions in semiconductor substrate 120. Although not shown, through-vias may be formed to extend into semiconductor substrate 120, and the through-vias are used to electrically inter-couple the features on opposite sides of wafer 100. An example of such through-vias are the through-vias 216 of FIG. 4, which may be integrated into FIG. 3.

In accordance with some embodiments of the present disclosure, wafer 100 includes integrated circuit devices 122, which are formed on the top surface of semiconductor substrate 120. Example integrated circuit devices 122 may include Complementary Metal-Oxide Semiconductor (CMOS) transistors, resistors, capacitors, diodes, and/or the like. The details of integrated circuit devices 122 are not illustrated herein. In accordance with other embodiments, wafer 100 is used for forming interposers, in which semiconductor substrate 120 may be a semiconductor substrate or a dielectric substrate.

Inter-Layer Dielectric (ILD) 124 is formed over semiconductor substrate 120, and fills the space between the gate stacks of transistors (not shown) in integrated circuit devices 122. In accordance with some embodiments, ILD 124 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS) formed silicon oxide, or the like. ILD 124 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 128 are formed in ILD 124, and are used to electrically connect integrated circuit devices 122 to overlying metal lines 134 and vias 136. In accordance with some embodiments of the present disclosure, contact plugs 128 are formed of a conductive material selected from tungsten, aluminum, copper, titanium, tantalum, titanium nitride, tantalum nitride, alloys therefore, and/or multi-layers thereof. The formation of contact plugs 128 may include forming contact openings in ILD 124, filling a conductive material(s) into the contact openings, and performing a planarization (such as Chemical Mechanical Polish (CMP) process) to level the top surfaces of contact plugs 128 with the top surface of ILD 124.

Over ILD 124 and contact plugs 128 resides interconnect structure 130. Interconnect structure 130 includes dielectric layers 132, and metal lines 134 and vias 136 formed in dielectric layers 132. Dielectric layers 132 are alternatively referred to as Inter-Metal Dielectric (IMD) layers 132 hereinafter. In accordance with some embodiments of the present disclosure, at least the lower ones of dielectric layers 132 are formed of a low-k dielectric material having a dielectric constant (k-value) lower than about 3.0 or about 2.5. Dielectric layers 132 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 132 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 132 includes depositing a porogen-containing dielectric material, and then performing a curing process to drive out the porogen, and hence the remaining dielectric layers 132 becomes porous. Etch stop layers (not shown), which may be formed of silicon carbide, silicon nitride, or the like, may be formed between IMD layers 132, and are not shown for simplicity.

Metal lines 134 and vias 136 are formed in dielectric layers 132. The metal lines 134 at a same level are collectively referred to as a metal layer hereinafter. In accordance with some embodiments of the present disclosure, interconnect structure 130 includes a plurality of metal layers that are interconnected through vias 136. Metal lines 134 and vias 136 may be formed of copper or copper alloys, and they can also be formed of other metals. The formation process may include single damascene and dual damascene processes. In a single damascene process, a trench is first formed in one of dielectric layers 132, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

Metal lines 134 include metal lines 134A, which may be referred to as top metal lines. Top metal lines 134A are also collectively referred to as being a top metal layer. The respective dielectric layer 132A may be formed of a non-low-k dielectric material such as Un-doped Silicate Glass (USG), silicon oxide, silicon nitride, or the like. Dielectric layer 132A may also be formed of a low-k dielectric material, which may be selected from the similar materials of the underlying IMD layers 132.

In accordance with some embodiments of the present disclosure, dielectric layers 138 and 152 are formed over the top metal lines 134A. Dielectric layers 138 and 152 may be formed of silicon oxide, silicon oxynitride, silicon oxycarbide, or the like, and in some embodiments dielectric layer 138 may be formed of multiple dielectric sub-layers 138A, 138B, and 138C, for example. First, dielectric sub-layer 138A may be formed. Via openings corresponding to vias 146 may next be formed in the dielectric sub-layer 138A using a photo lithographic process using, for example, photo resists and/or hard masks which are formed and patterned over dielectric sub-layer 138A to aid the formation of via openings corresponding to the vias 146. An anisotropic etch may be used to form these trenches through the photo resists and/or hard masks.

Vias 146 and metal features 144 may be formed over the dielectric sub-layer 138A. Vias 146 and metal features 144 may be formed by processes similar to the formation of vias 136 and metal lines 134, described above, though other suitable process may be used. Metal features 144 and vias 146 may be formed of copper or copper alloys, and they can also be formed of other metals. In an embodiment, the metal features 144 and/or vias 146 may be formed of aluminum or an aluminum copper alloy. In some embodiments, the metal features 144 may be used for die testing.

In some embodiments, the metal features 144 may be directly probed for performing chip probe (CP) testing of the wafer 100. Optionally, solder regions (e.g., solder balls or solder bumps) may be disposed on the metal features 144 and the solder regions may be used to perform CP testing on the wafer 100. CP testing may be performed on the wafer 100 to ascertain whether the each device die 105 of wafer 100 is a known good die (KGD). Thus, only device dies 105 which are KGDs undergo subsequent processing for packaging, and dies which fail the CP testing are not packaged. After testing, the solder regions (if any) may be removed in subsequent processing steps.

The dielectric sub-layer 138B may then be deposited over the metal features 144 up to a desired thickness. In some embodiments, the dielectric sub-layer 138B may then be planarized to level the top surface, while in other embodiments, the leveling step may be omitted. In some embodiments, the dielectric sub-layer 138C is then deposited. Other embodiments may not use the dielectric sub-layer 138C and it may be omitted.

Next, bond pad vias 156 and bond pad vias 157 may be formed. Bond pad vias 156 extend through the entire dielectric layer(s) 138 to the interconnect structure 130 and bond pad vias 157 extend to the metal features 144 and electrically couple thereto. Openings for the bond pad vias 156 and bond pad vias 157 may be formed using photo resists (not shown) and/or hard masks (not shown) which are formed and patterned over dielectric layer 138 to aid the formation of the openings for the bond pad vias 156 and bond pad vias 157.

In accordance with some embodiments of the present disclosure, an anisotropic etch is performed to form the openings. The etch may stop on either the metal feature 144 for bond pad vias 157 or on the metal lines 134 of interconnect structure 130 for bond pad vias 156.

The openings for the bond pad vias 156 and the bond pad vias 157 may next be filled with conductive materials. A conductive diffusion barrier (not shown) may be formed first. In accordance with some embodiments of the present disclosure, the conductive diffusion barrier may be formed of titanium, titanium nitride, tantalum, tantalum nitride, or the like. The conductive diffusion barrier may be formed, for example, using Atomic Layer Deposition (ALD), Physical Vapor Deposition (PVD), or the like. The conductive diffusion barrier may include a layer in the openings for the bond pad vias 156 and the bond pad vias 157 and a layer extending over the upper surface of the dielectric layer 138.

Next, a metallic material is deposited to form the bond pad vias 156 and the bond pad vias 157, for example, through Electro-Chemical Plating (ECP). The metallic material is deposited on the conductive diffusion barrier and fills the remaining openings for the bond pad vias 156 and the bond pad vias 157. The metallic material may also extend over the top surface of the dielectric layer 138. The metallic material may include copper or copper alloy. The bond pad vias 156 and bond pad vias 157 may be formed simultaneously.

A planarization process such as a Chemical Mechanical Polish (CMP) process may then be performed to remove excess portions of the metallic material and the diffusion barrier, until dielectric layer 138 is exposed. The remaining portions of the diffusion barrier and metallic material include bond pad vias 156 and bond pad vias 157.

Next, a dielectric bonding layer 152 may be formed over the dielectric layer 138 and openings formed therein for bond pads 154. The openings may be formed using photo resists (not shown) and/or hard masks (not shown) which are formed and patterned over dielectric bonding layer 152 to aid the formation of the openings for the bond pads 154. In accordance with some embodiments of the present disclosure, an anisotropic etch or wet etch is performed to form the openings for the bond pads 154. The etch may stop on dielectric sub-layer 138C, which may function as an etch stop, in some embodiments. In other embodiments the dielectric bonding layer 152 may have etch selectivity with the dielectric layer 138, so that the dielectric layer 138 is not etched through after the dielectric bonding layer 152 is etched through. In some embodiments, the etch may be time based. The openings for the bond pads 154 may expose upper surfaces of the bond pad vias 156 and bond pad vias 157.

Next, a diffusion barrier and metallic material may be deposited in the openings to form the bond pads 154. Forming the bond pads 154 may use processes and materials similar to those used to form the bond pad vias 156 and bond pad vias 157, described above. A planarization process such as a Chemical Mechanical Polish (CMP) process may then be performed to remove excess portions of the metallic material and the diffusion barrier, until the dielectric bonding layer 152 is exposed. The remaining portions of the diffusion barrier and metallic material include bond pads 154 which are subsequently used for bonding to another device. It is appreciated that metal lines may also be formed simultaneously as bond pads 154.

In some embodiments, the bond pad vias 156 and 157 may be formed at the same time as the bond pads 154. In such embodiments, after the dielectric bonding layer 152 is formed, openings are made in the dielectric bonding layer 152, as described above. Then, further openings are made in the dielectric layer 138 for the bond pad vias 156 and bond pad vias 157, as described above. Then, the conductive diffusion barrier and metallic material may be formed, as described above, for both the bond pad vias 156 and 157 and the bond pads 154 in the same process. Afterwards, a planarization process such as a CMP process may be used to remove excess portions of the metallic material and the diffusion barrier, until the dielectric bonding layer 152 is exposed. The remaining portions of the diffusion barrier and metallic material include bond pads 154 which are subsequently used for bonding to another device. Metal lines may also be formed simultaneously as bond pads 154.

The location and number of bond pads 154 may be adjusted based on the devices which are to be bonded to them in subsequent processes. In some embodiments, one or more of the bond pads 154 may not be electrically connected to any devices in the device die 105. Such bond pads 154 may be considered dummy bond pads. In some embodiments, dummy bond pads 154 may continue across the surface of the device die 105, while in other embodiments, bond pads 154 including dummy bond pads may be located only where other devices are to be attached.

FIG. 4 illustrates the formation of wafer 200, which includes device dies 205 (e.g., device die 205a and device die 205b) therein. In accordance with some embodiments of the present disclosure, device dies 205 are logic dies, which may be CPU dies, MCU dies, IO dies, Base-Band dies, or AP dies. Device dies 205 may also be memory dies. Wafer 200 includes semiconductor substrate 220, which may be a silicon substrate.

Device dies 205 may include integrated circuit devices 222, ILD 224 over the integrated circuit devices 222, and contact plugs 228 to electrically connect to the integrated circuit devices 222. Device dies 205 may also include interconnect structures 230 for connecting to the active devices and passive devices in device dies 205. Interconnect structures 230 include metal lines 234 and vias 236.

Through-Silicon Vias (TSVs) 216, sometimes referred to as through-semiconductor vias or through-vias, are formed to penetrate into the semiconductor substrate 220 (and eventually through the semiconductor substrate 220 by revealing from the opposite side). TSVs 216 are used to connect the devices and metal lines formed on the front side (the illustrated top side) of semiconductor substrate 220 to the backside. TSVs 216 may be formed using processes and materials similar to those used to form the bond pad vias 156, discussed above, and are not repeated, including for example a time-based etching process so that the TSVs 216 may have a bottom which is disposed between the top surface and the bottom surface of the semiconductor substrate 220.

Device die 205 may include dielectric layers 238 and dielectric bonding layer 252. Vias 246 and metal features 244 may be formed and disposed in the dielectric layers 238 (which may include multiple dielectric layers 238A, 238B, and 238C). Bond pad vias 256 and bond pad vias 257 are also formed and disposed in dielectric layers 238, and bond pads 254 are formed and disposed in the dielectric bonding layer 252.

The processes and materials used to form the various features of device die 205 may be similar to the process and materials used to form their like features in device die 105, and hence the details are not repeated herein. Like features between device die 105 and device die 205 share the same last two numbers in their labels.

Wafer 200 is singulated into a plurality of discrete device dies 205, including for example, device die 205a and device die 205b.

FIG. 5 illustrates the bonding of the device dies 205, such as device die 205a to device die 105. In the illustrated embodiment, each of the device dies 105 is still within the wafer 100. In some embodiments, each of the KGDs device dies 105 may be singulated from the wafer 100 and attached, for example, to a carrier substrate for further processing. Each of the device dies 205 bonded to the device dies 105 may have been tested and determined to be a KGD prior to bonding to the device dies 105.

While one device die 205 is illustrated as being bonded to the device dies 105, it should be appreciated that other device dies like unto the device die 205 may be bonded to the device dies 105. The other device dies may be identical to the device die 205 or may be different from the device die 205. For example, the device dies 205 and other device dies may be different types of dies selected from the above-listed types. Furthermore, device dies 205 and the other device dies may be formed using different technologies such as 45 nm technology, 28 nm technology, 20 nm technology, or the like. Also, device dies 205 may be a digital circuit die, while the other device dies may be an analog circuit die. Device dies 105 and 205 (and other device dies, if any) in combination function as a system. Splitting the functions and circuits of a system into different dies such as device dies 105 and 205 may optimize the formation of these dies, and may result in the reduction of manufacturing cost.

Figure 6:
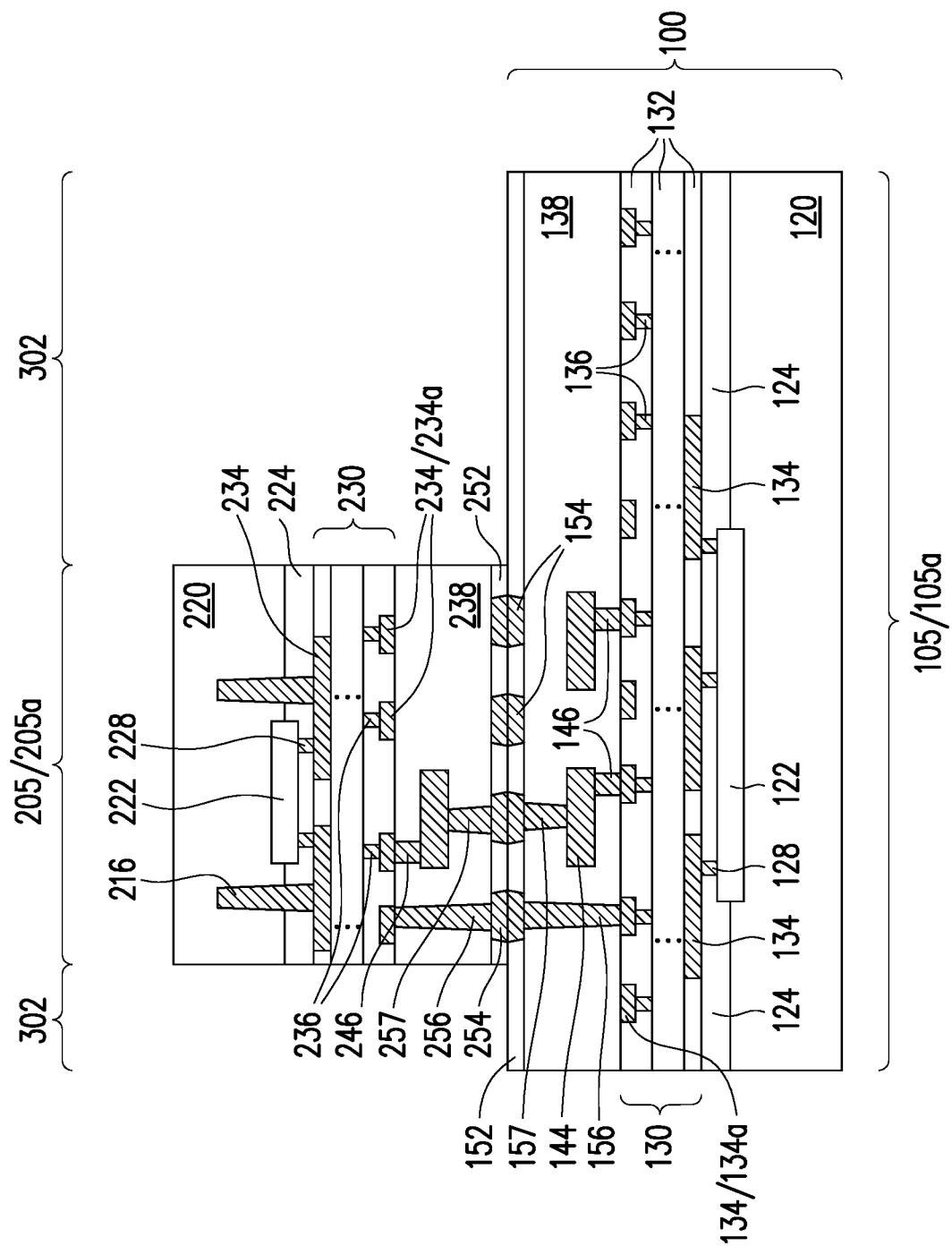

FIG. 6 illustrates a close up of the dashed box of FIG. 5. One of the device dies 205, such as device die 205a may be placed on the wafer 100, for example by a pick and place process. The bonding of device dies 205 to device die 105 may be achieved through hybrid bonding. For example, bond pads 254 are bonded to bond pads 154 through metal-to-metal direct bonding. In accordance with some embodiments of the present disclosure, the metal-to-metal direct bonding is copper-to-copper direct bonding. Bond pads 254 may have sizes greater than, equal to, or smaller than, the sizes of the respective bond pads 154. Furthermore, dielectric bonding layers 252 are bonded to dielectric bonding layer 152 through dielectric-to-dielectric bonding, which may be fusion bonding, for example, with Si—O—Si bonds generated. Gaps 302 are left surrounding device dies 205 and between neighboring device dies 205.

To achieve the hybrid bonding, device dies 205 are positioned in relation to the devices dies 105 to align their respective bond pads 154 and bond pads 254, and the device dies 105 and device dies 205 are pressed together. Then, an anneal is performed to cause the inter-diffusion of the metals in bond pads 154 and the corresponding overlying bond pads 254. The annealing temperature may be higher than about 350° C., and may be in the range between about 350° and about 550° C. in accordance with some embodiments. The annealing time may be in the range between about 1.5 hours and about 3.0 hours, and may be in the range between about 1.0 hour and about 2.5 hours in accordance with some embodiments. Through the hybrid bonding, bond pads 254 are bonded to the corresponding bond pads 154 through direct metal bonding caused by metal inter-diffusion. Likewise, the dielectric bonding layer 252 is fusion bonded to the corresponding dielectric bonding layer 152. Areas where the bond pads 154/254 of one device die 105/205 are in contact with the dielectric bonding layer 254/154 of the opposing device die 205/105 are not bonded.

Figure 7:
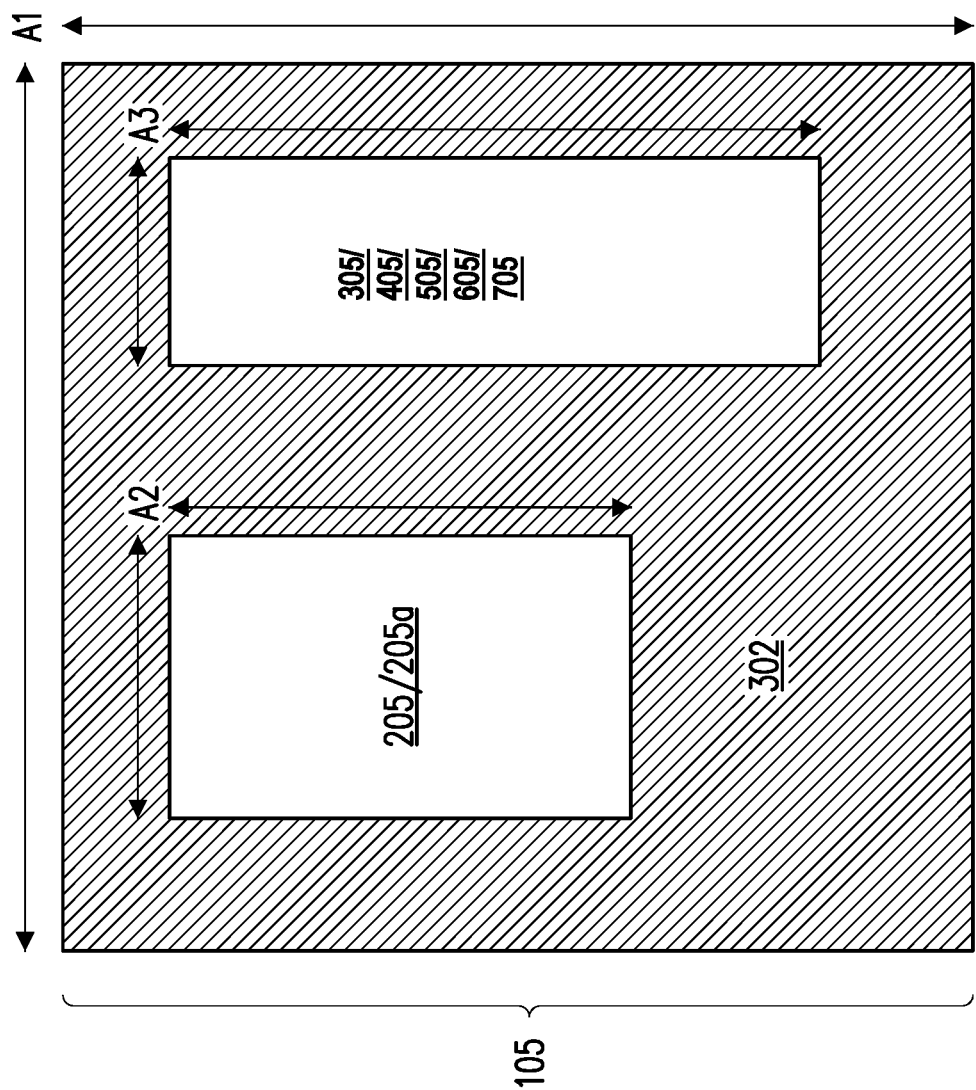
FIG. 7 is a top down view of a device die disposed on another device die, in accordance with some embodiments.

FIG. 7 is a top down view (i.e., plan view) of the device die 205, such as device die 205a, on the device die 105, in accordance with some embodiments. The gap 302 is shown surrounding the device die 205. The gap 302 may be filled in with a gap fill material (see, e.g., gap fill dielectric layer 162 of FIG. 28), such as a dielectric material such as a resin, epoxy, polymer, oxide, nitride, the like, or combinations thereof. Often, the gap fill material is an organic material. Some dielectric materials typically have high Coefficients of Thermal Expansion (CTEs), which may be 10 ppm/C° or higher. This is significantly greater than the CTE of silicon (such as semiconductor substrate 220), which is about 3 ppm/C°. Accordingly, some dielectric materials can cause the warpage of wafer 100. If such materials were used, for example, as a gap fill material in the present embodiment, warpage would likely occur because the CTE of the semiconductor substrate 220 (FIG. 4), which may include silicon, such as pure silicon or doped silicon, has a large CTE mismatch between the gap fill material surrounding it. The lateral area A1 (i.e., footprint or surface area), for example, of device die 105 is more than twice the lateral area A2 (i.e., footprint or surface area) of the device die 205. Or in other words, the lateral area A2 is less than 50% the lateral area A1. Decreasing the amount of the gap fill material relative to the semiconductor substrate 220 of the device die 205 would reduce the warpage. Eliminating or reducing the gap fill material, however, may not be practical in view of the subsequent processes, such as adding a top interconnect and top connectors.

Embodiments of the present disclosure effectively increase the total lateral area or footprint (or surface area) of the device die 205 by attaching inactive or dummy structures, such as inactive structures 305, 405, 505, 605, and/or 705 on the surface of the device die 105 so that the lateral area A2 of the device die 205 plus the lateral area(s) (e.g., lateral area A3) of the one or more inactive structures is greater than 50% of the lateral area A1 of the device die 105. This decreases the effective lateral mismatch between the subsequently formed gap fill material and the semiconductor substrate 220 of the device die 205. As a result, warpage of the wafer 100 and the resulting package device 800 (see, e.g., FIG. 28) is substantially reduced. The inactive structures 305, 405, 505, 605, and/or 705 may be selected so that their combined lateral areas plus the lateral area of the device die(s) 205 is at least 50% up to about 95% the lateral area A1 of the device die 105.

Figure 8:
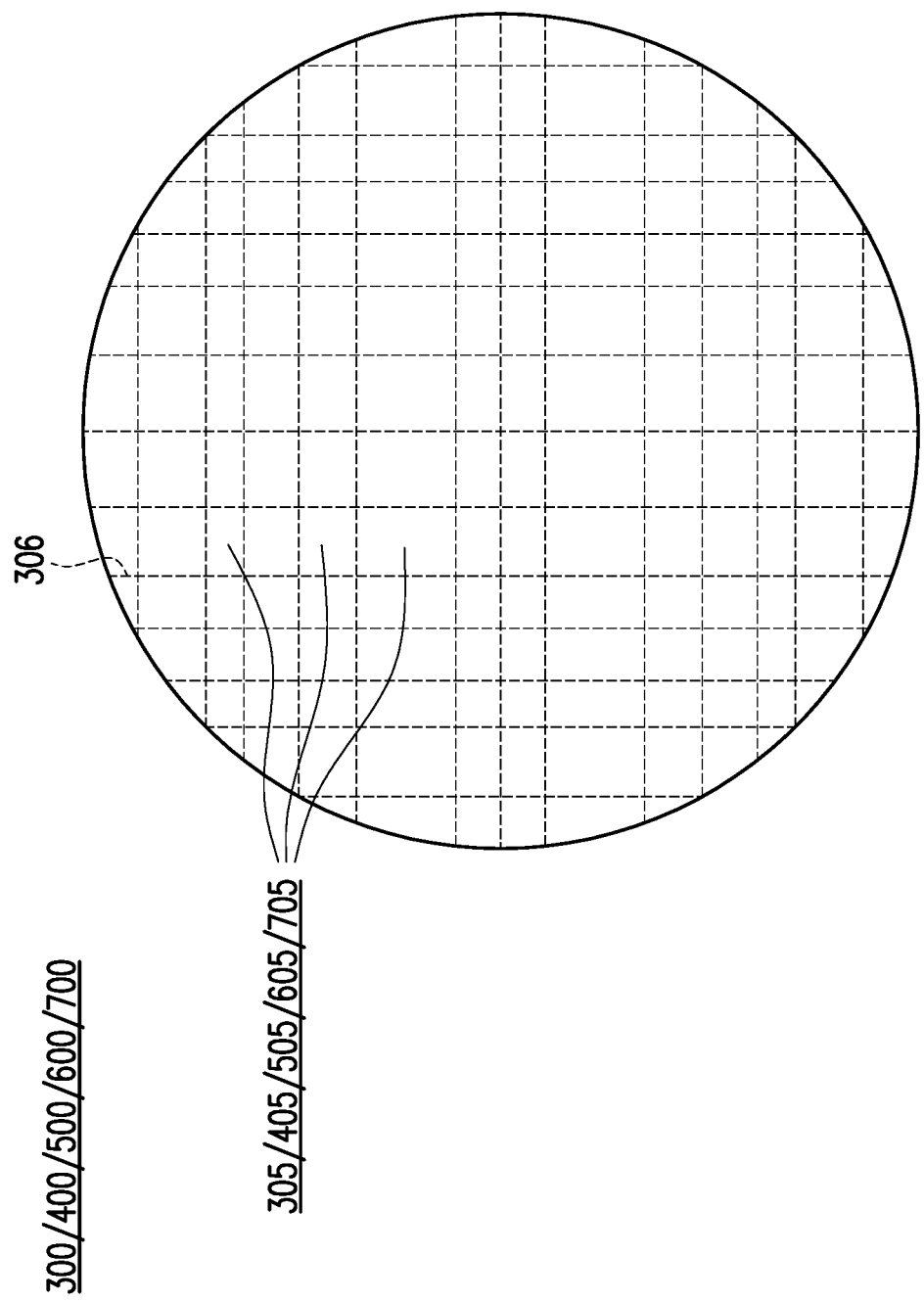
FIG. 8 illustrates a top down view of an inactive package component with multiple inactive structures defined within.

FIG. 8 illustrates a top down view (i.e., plan view) of an inactive package component 300, 400, 500, 600, or 700 (which may be a wafer, as illustrated) with multiple inactive structures 305, 405, 505, 605, or 705 defined within. The inactive package components 300, 400, 500, 600, and 700, will each be referred to respectively as wafer 300, wafer 400, wafer 500, wafer 600, and wafer 700 for ease, but it should be appreciated that the resulting package components may be formed from structures other than wafers. Each of the multiple inactive structures 305, 405, 505, 605, or 705 may respectively be of a same general design. The dashed lines represent dicing lines 306 where the inactive structures 305, 405, 505, 605, or 705 will be separated from each other in a subsequent dicing process. The dicing lines 306 may be spaced at regular intervals in some embodiments, or may be spaced at varying intervals, such as in the illustrated embodiment, to provide several different sized inactive structures 305, 405, 505, 605, and 705 from a single package component 300, 400, 500, 600, or 700, respectively.

Figure 9:
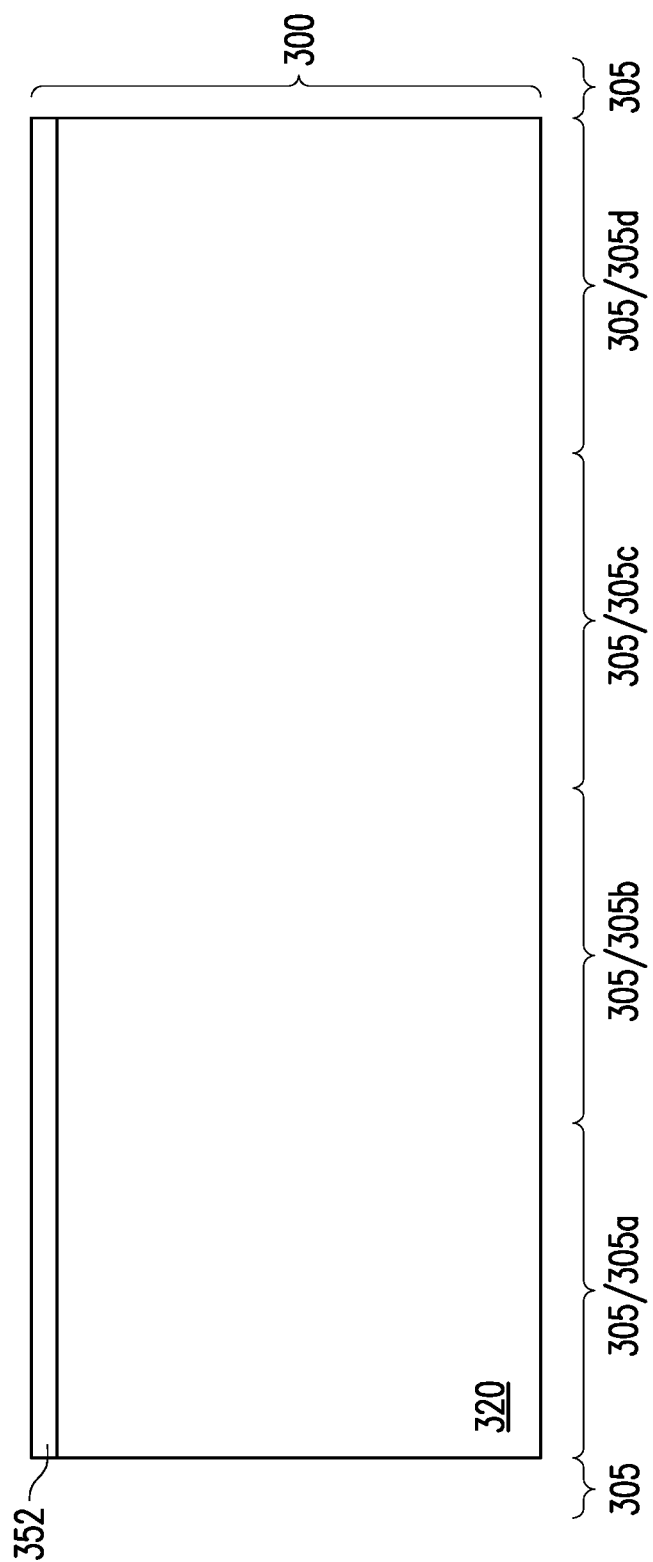
FIGS. 9 through 22 illustrate intermediate stages for various inactive structures and their relation to a device die, in accordance with some embodiments.

FIG. 9 illustrates the wafer 300 with multiple inactive structures 305 defined within, in accordance with some embodiments. The wafer 300 includes semiconductor substrate 320, which may be formed from the same candidates of materials described above with respect to semiconductor substrate 120 of FIG. 3. In particular, the semiconductor substrate 320 may be formed from the same material as semiconductor substrate 220 of FIG. 4.

A dielectric bonding layer 352 is formed over the semiconductor substrate 320. The dielectric bonding layer 352 may be formed using materials and processes similar to those discussed above with respect to FIG. 3.

The wafer 300 may be singulated to form individual inactive structures 305.

Figure 10:
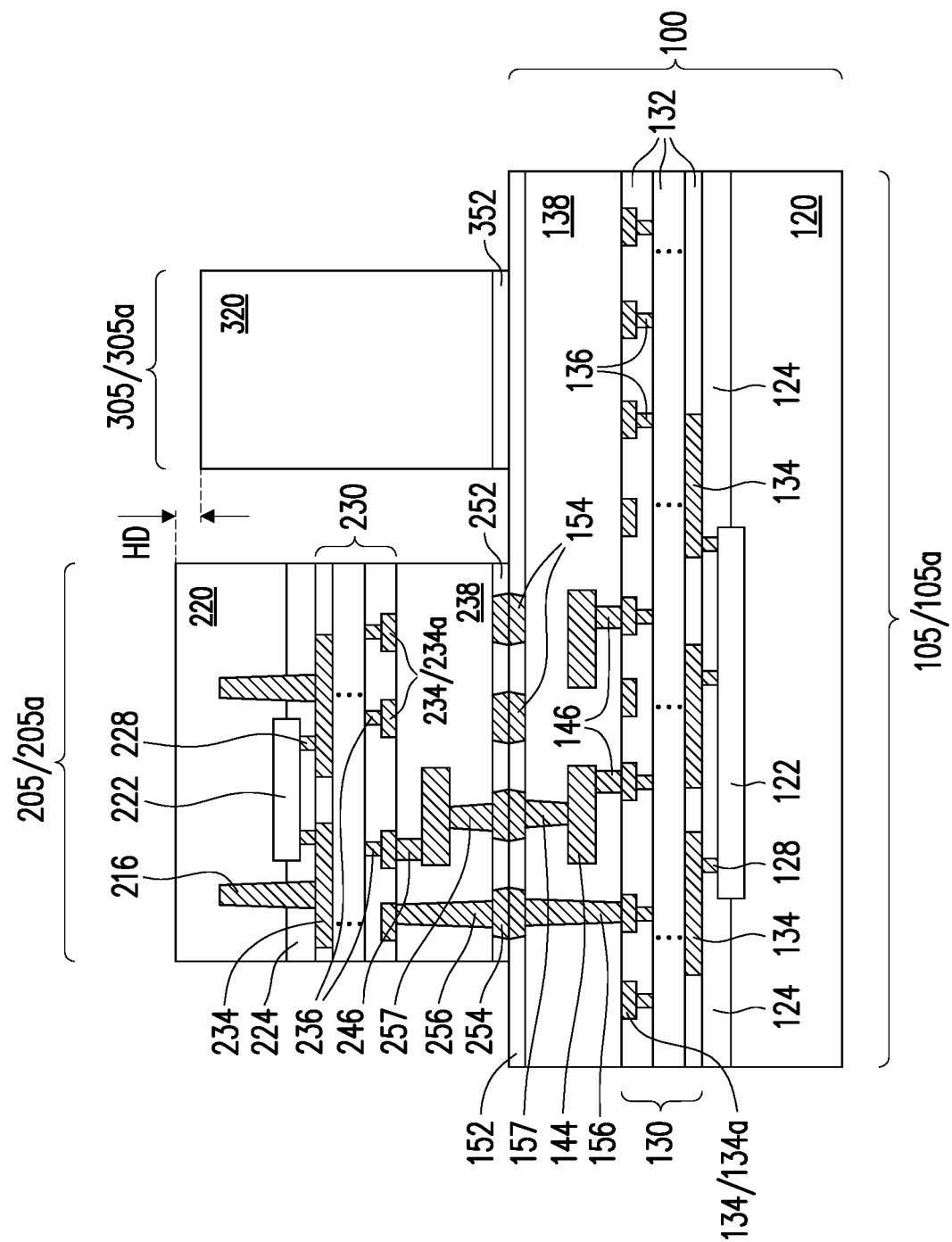

In FIG. 10, an inactive structure 305, such as the inactive structure 305a is bonded to the device die 105 through dielectric-to-dielectric bonding, which may be fusion bonding, for example, with Si—O—Si bonds generated. The bonding may be performed by contacting the dielectric bonding layer 352 to the dielectric bonding layer 152 and annealing the device to form bonds between the dielectric bonding layers 152 and 352. The bonding may be performed at the same time as the hybrid bonding, described above with respect to FIG. 6, or may be performed in a separate process.

The thickness of the inactive structure 305 may be different than the thickness of the device die 205. The thickness of the inactive structure 305 may be greater or less than the thickness of the device die 205 by a height difference HD between about −200 µm and about 200 µm. A height difference may also be realized in the inactive structures 405, 505, 605, and 705, discussed below.

Figure 11:
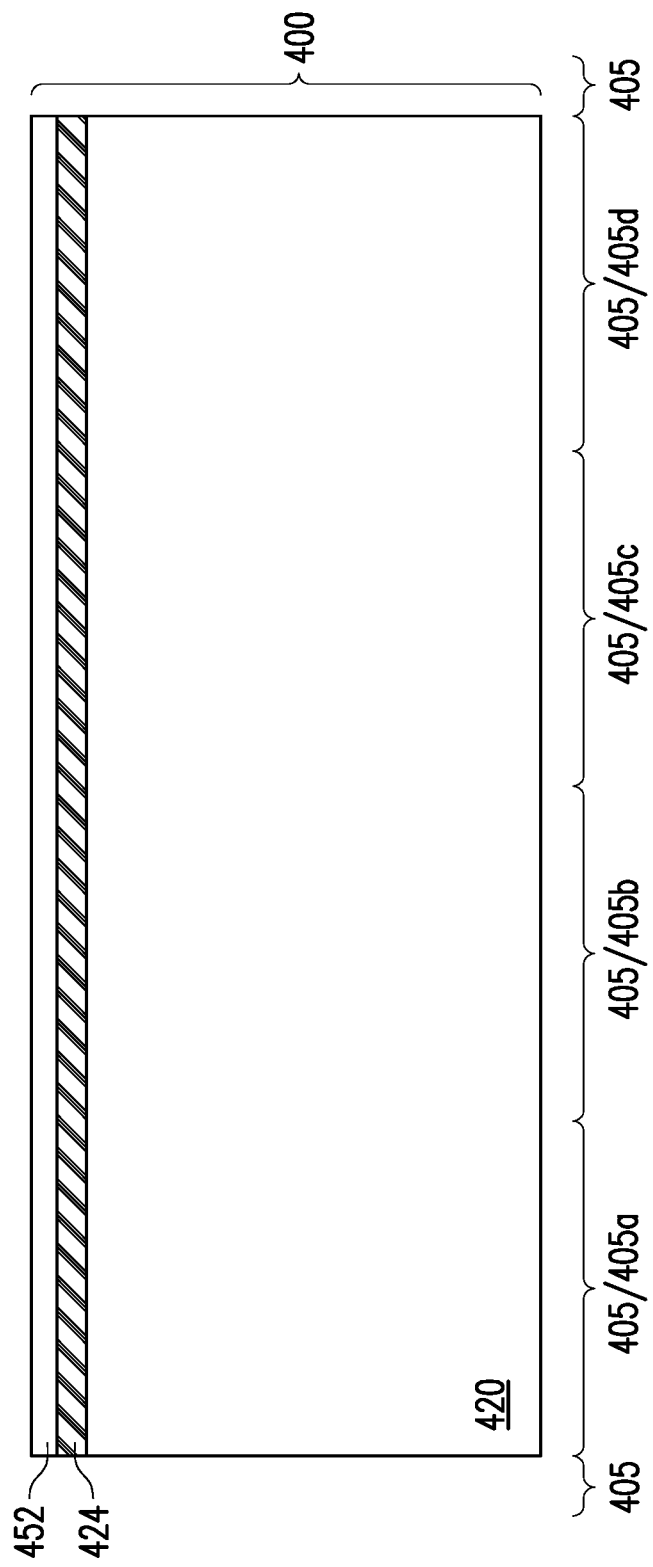

FIG. 11 illustrates the wafer 400 with multiple inactive structures 405 defined within, in accordance with some embodiments. The wafer 400 includes semiconductor substrate 420, which may be formed from the same candidates of materials described above with respect to semiconductor substrate 120 of FIG. 3. In particular, the semiconductor substrate 320 may be formed from the same material as semiconductor substrate 220 of FIG. 4.

A tensile film 424 is formed over the semiconductor substrate 420. The tensile film 424 may be formed to resist warpage or twisting to provide further stability to the package after the gap 302 is filled with a gap-fill material. The tensile film 424 may be formed over semiconductor substrate 420 through suitable semiconductor deposition processes. In some embodiments, the tensile film 424 is formed of suitable semiconductor materials having intrinsic tensile stresses. For example, the tensile film 424 may be formed of nitride materials such as silicon nitride, titanium nitride and/or the like. Alternatively, the tensile film layer may be formed of suitable oxide materials. In some embodiments, the thickness of the tensile film 424 is between about 100 Å and about 5000 Å. While FIG. 11 illustrates a single tensile film (e.g., the tensile film 424), the tensile film 424 may be made of multiple layers.

The stress of the tensile film 424 may be further controlled through deposition process conditions as well as by adding dopants. In some embodiments, the tensile stress of the tensile film 424 may be controlled to be between about 20 Mpa and about 200 Mpa, though other values are contemplated and may be used. Where radio frequency is used to assist deposition (e.g., RF-PVD), as AC bias is increased during deposition, film stress may likewise be increased. In some embodiments, AC bias may be between 1 kV and 20 kV. RF may be in a range of about 1 MHz to about 15 MHz. Substrate temperature during deposition also impacts film stress. In some embodiments, the temperature of the substrate may be between about 250° C. and about 400° C. In some embodiments, tensile film 424 may be doped by a suitable dopant, such as carbon or silicon to enhance and/or further control film stress. Carbon may be doped to a concentration between about $10^{15}$ cm$^{-3}$ and about $10^{18}$ cm$^{-3}$. Silicon may be doped to a concentration between about $10^{15}$ cm$^{-3}$ and about $10^{18}$ cm$^{-3}$. Other concentrations are contemplated and may be used. Silicon or carbon may be doped in situ during the formation of the tensile film 424 or may be doped by subsequent ion implantation. Higher concentrations of dopants exhibit greater stresses in the tensile film 424. Selecting carbon and/or silicon to have doping concentrations in the above ranges provides tunable film stress. Other dopant concentrations are contemplated and may be used instead.

The dielectric bonding layer 452 is formed over the tensile film 424. The dielectric bonding layer 452 may be formed using materials and processes similar to those discussed above with respect to dielectric bonding layer 152 of FIG. 3.

The wafer 400 may be singulated to form individual inactive structures 405.

Figure 12:
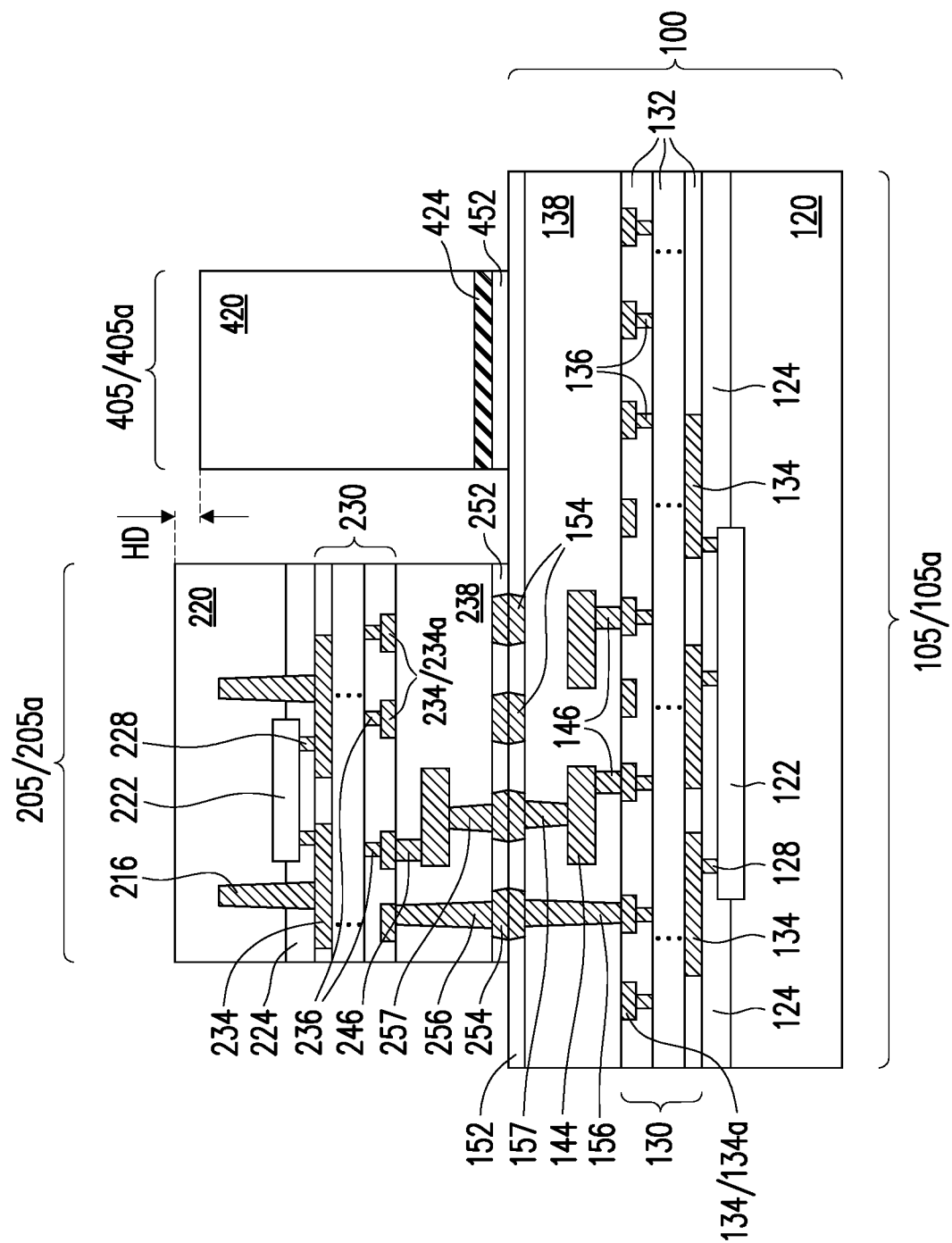

In FIG. 12, an inactive structure 405, such as the inactive structure 405a is bonded to the device die 105 through dielectric-to-dielectric bonding, which may be fusion bonding, for example, with Si—O—Si bonds generated. The bonding may be performed by contacting the dielectric bonding layer 452 to the dielectric bonding layer 152 and annealing the device to form bonds between the dielectric bonding layers 152 and 452. The bonding may be performed at the same time as the hybrid bonding, described above with respect to FIG. 6, or may be performed in a separate process.

Figure 13:
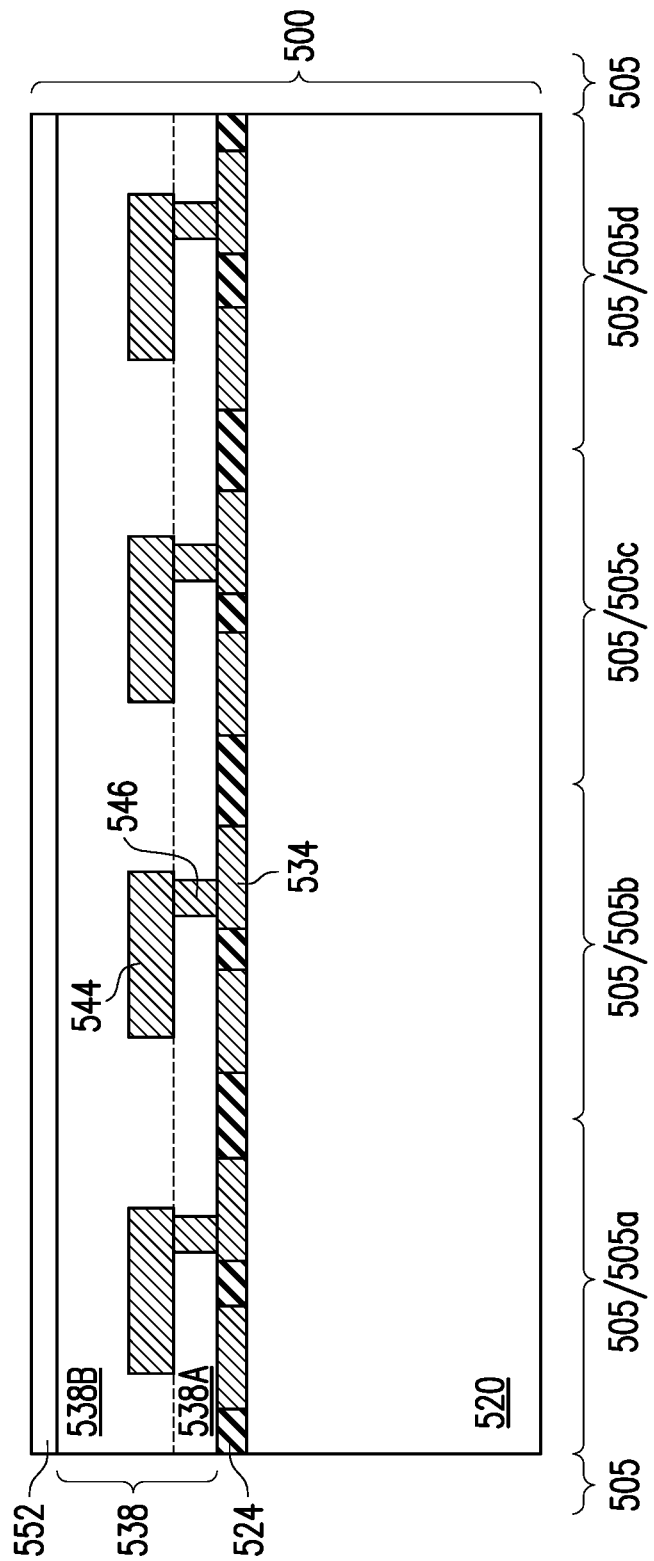

FIG. 13 illustrates the wafer 500 with multiple inactive structures 505 defined within, in accordance with some embodiments. The wafer 500 includes semiconductor substrate 520, which may be formed from the same candidates of materials described above with respect to semiconductor substrate 120 of FIG. 3. In particular, the semiconductor substrate 520 may be formed from the same material as semiconductor substrate 220 of FIG. 4.

In some embodiments, a tensile film 524 is formed over the semiconductor substrate 520. The tensile film 524 may be formed of the same processes and materials described above with respect to the tensile film 424 of FIG. 11. In other embodiments, the film 524 is a dielectric material, such as an ILD material, which may be formed using processes and materials such as those discussed above with regard to ILD 124 of FIG. 3.

Metal lines 534 may be formed in the tensile film 524. The metal lines 534 provide further tensile properties to the tensile film 524 to reduce warpage of the final package (e.g., package device 800 of FIG. 28). The metal lines 534 may be formed of copper or copper alloys, and they can also be formed of other metals. Trenches may be formed in the tensile film 524, followed by filling the trenches with a conductive material. A planarization process such as a CMP process is then performed to remove the excess portions of the conductive material higher than the top surface of the tensile film 524 layer, leaving a metal line in the trench. The conductive material may include a diffusion barrier and a copper-containing metallic material over the diffusion barrier. The diffusion barrier may include titanium, titanium nitride, tantalum, tantalum nitride, or the like.

In some embodiments, dielectric layers 538 are formed over the metal lines 534. Dielectric layers 538 may be formed of silicon oxide, silicon oxynitride, silicon oxycarbide, or the like, and in some embodiments may be formed of multiple layers, e.g., dielectric sub-layers 538A and 538B.

In some embodiments, vias 546 and metal features 544 may also be formed within the dielectric layers 538. The vias 546 and metal features 544 may further provide tensile properties to reduce warpage of the final package (e.g., package device 800 of FIG. 28).

As an example of forming the vias 546 and metal features 544, first, dielectric sub-layer 538A may be formed. Via openings corresponding to vias 546 may next be formed in the dielectric sub-layer 538A using a photo lithographic process using, for example, photo resists and/or hard masks which are formed and patterned over dielectric sub-layer 538A to aid the formation of via openings corresponding to the vias 546. An anisotropic etch or other suitable etch may be used to form these trenches through the photo resists and/or hard masks.

Vias 546 and metal features 544 may be formed over the dielectric sub-layer 538A. Vias 546 and metal features 544 may be formed by processes similar to the formation of vias 136 and metal lines 134, described above with respect to FIG. 3, though other suitable process may be used. Metal features 544 and vias 546 may be formed of copper or copper alloys, and they can also be formed of other metals. In an embodiment, the metal features 544 and/or vias 546 may be formed of aluminum or an aluminum copper alloy.

The dielectric sub-layer 538B may then be deposited over the metal features 544 up to a desired thickness. In some embodiments, the dielectric sub-layer 538B may then be planarized to level the top surface, while in other embodiments, the leveling step may be omitted.

The dielectric bonding layer 552 is formed over the dielectric layers 538. The dielectric bonding layer 552 may be formed using materials and processes similar to those discussed above with respect to dielectric bonding layer 152 of FIG. 3. The dielectric bonding layer 552 may be planarized, in some embodiments.

The wafer 500 may be singulated to form individual inactive structures 505.

Figure 14:
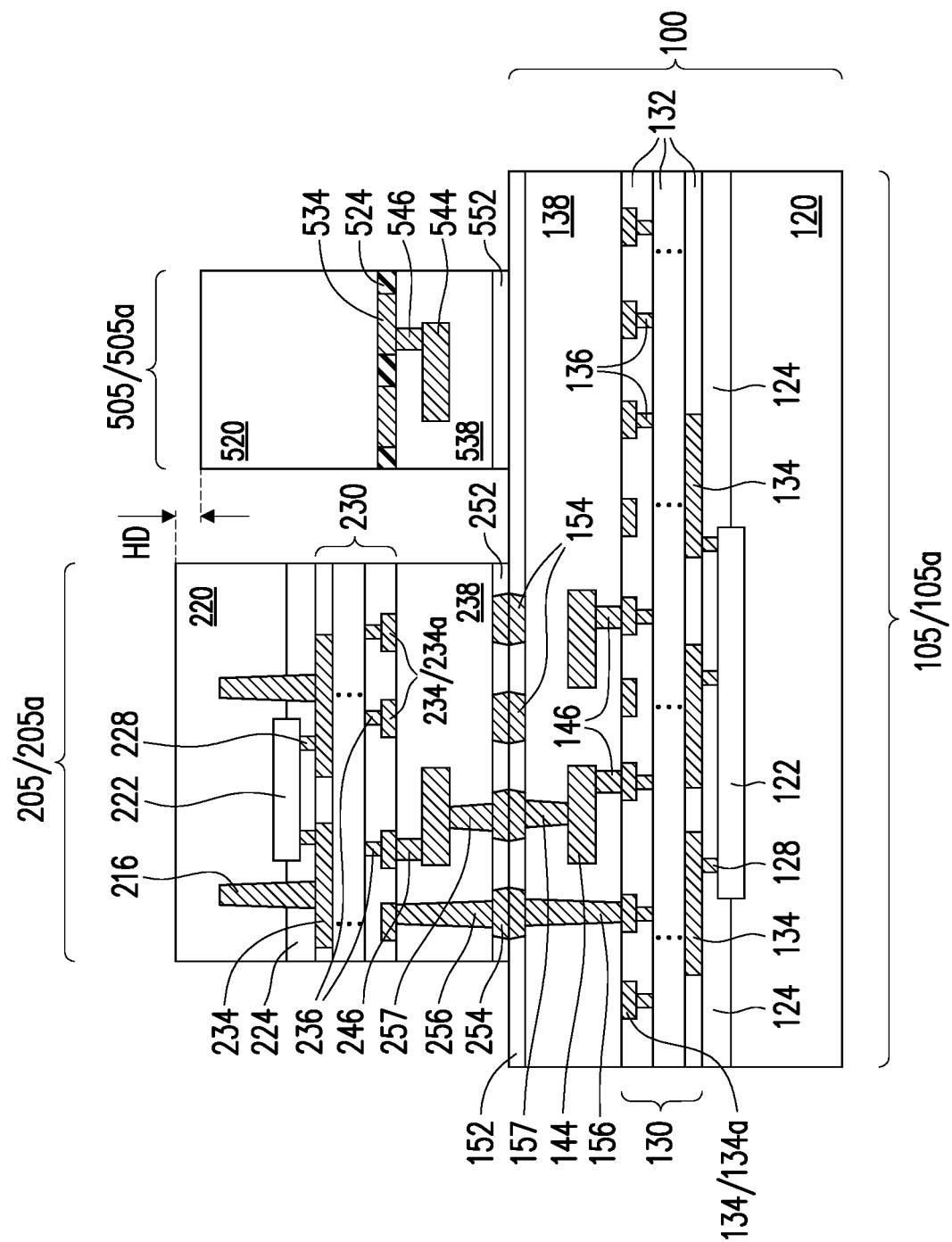

In FIG. 14, an inactive structure 505, such as the inactive structure 505a is bonded to the device die 105 through dielectric-to-dielectric bonding, which may be fusion bonding, for example, with Si—O—Si bonds generated. The bonding may be performed by contacting the dielectric bonding layer 552 to the dielectric bonding layer 152 and annealing the device to form bonds between the dielectric bonding layers 152 and 552. The bonding may be performed at the same time as the hybrid bonding, described above with respect to FIG. 6, or may be performed in a separate process.

Figure 15:
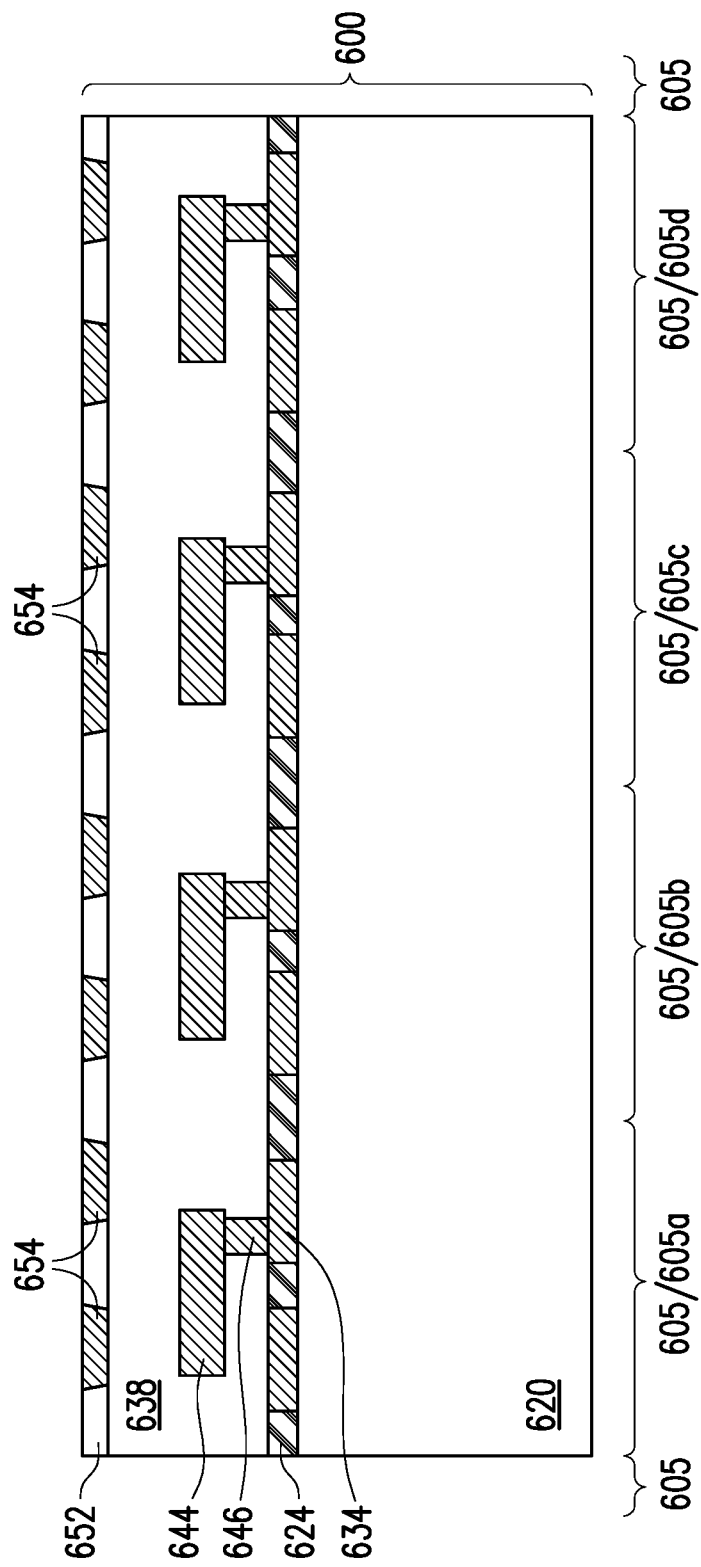

FIG. 15 illustrates the wafer 600 with multiple inactive structures 605 defined within, in accordance with some embodiments. The wafer 600 includes semiconductor substrate 620, which may be formed from the same candidates of materials described above with respect to semiconductor substrate 120 of FIG. 3. In particular, the semiconductor substrate 620 may be formed from the same material as semiconductor substrate 220 of FIG. 4.

In some embodiments, a tensile film 624 is formed over the semiconductor substrate 620. The tensile film 624 may be formed of the same processes and materials described above with respect to the tensile film 424 of FIG. 11. In other embodiments, the film 624 is a dielectric material, such as an ILD material, which may be formed using processes and materials such as those discussed above with regard to ILD 124 of FIG. 3.

Metal lines 634 may be formed in the tensile film 624. The metal lines may be formed using processes and materials similar to those discussed above with respect to FIG. 13. A dielectric layer 638 may be formed over the tensile film 624 and vias 646 and metal features 644 may be formed in the dielectric layer 638. The dielectric layer 638, vias 646, and metal features 644 may be formed using processes and materials similar to like structures (dielectric layer 538, vias 546, and metal features 544) of FIG. 13.

The dielectric bonding layer 652 is formed over the dielectric layers 638. The dielectric bonding layer 652 may be formed using materials and processes similar to those discussed above with respect to dielectric bonding layer 152 of FIG. 3. The dielectric bonding layer 652 may be planarized, in some embodiments.

Bond pads 654 may be formed in the dielectric bonding layer 652. The bond pads 654 may help provide a more secure bond between the inactive structure 605 and device die 105, to further help reduce warpage and reduce the likelihood of the inactive structure 605 peeling from the device die 105. Openings may first be formed for the bond pads 654 using photo resists (not shown) and/or hard masks (not shown) which are formed and patterned over dielectric bonding layer 652 to aid the formation of the openings for the bond pads 654. In accordance with some embodiments of the present disclosure, an anisotropic etch or other suitable etch is performed to form the openings for the bond pads 654. The etch may stop on dielectric layer 638, which may function as an etch stop, in some embodiments. In other embodiments, an etch stop layer may be disposed between the dielectric layer 638 and the dielectric bonding layer 652 (or may be part of the dielectric layer 638, similar to dielectric sub-layer 138C of FIG. 3). In some embodiments, the etch may be time based.

Next, an optional diffusion barrier and metallic material may be deposited in the openings to form the bond pads 654. Forming the bond pads 654 may use processes and materials similar to those used to form the bond pads 154 of FIG. 3. A planarization process such as a Chemical Mechanical Polish (CMP) process may then be performed to remove excess portions of the metallic material and the diffusion barrier (if used), until the upper surfaces of the bond pads 654 are level with the upper surfaces of the dielectric bonding layer 652. The remaining portions of the diffusion barrier (if used) and metallic material make up the bond pads 654 which are subsequently used for bonding to a device. It is appreciated that metal lines may also be formed simultaneously as bond pads 654.

The wafer 600 may be singulated to form individual inactive structures 605.

Figure 16:
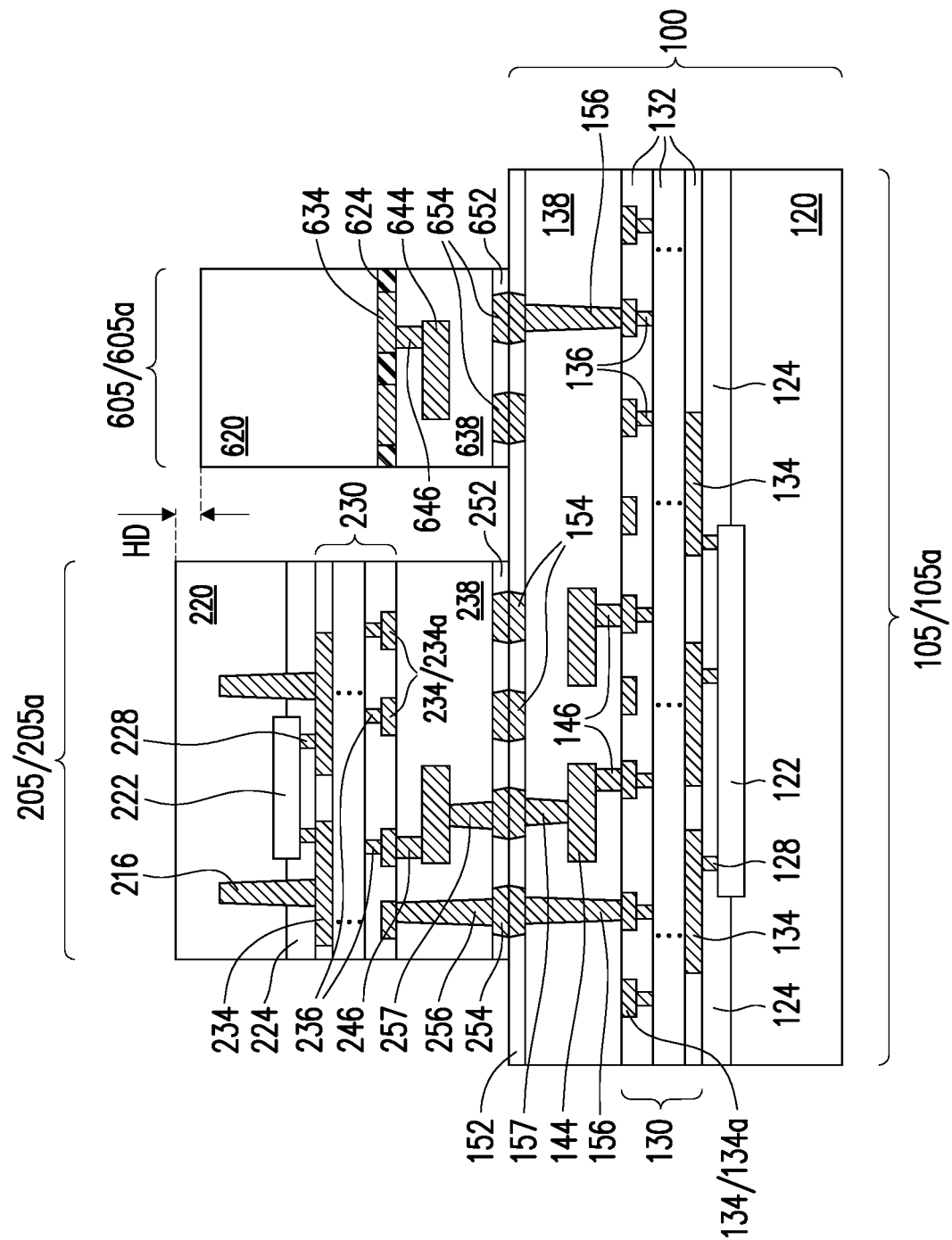

In FIG. 16, an inactive structure 605, such as the inactive structure 605a is bonded to the device die 105 through hybrid bonding, using processes similar to those described above with respect to FIG. 6. Corresponding bond pads 154 may be disposed in the device die 105 for the metal-to-metal bonding with the bond pads 654. Likewise, the dielectric bonding layer 652 is bonded to the dielectric bonding layer 152 using dielectric-to-dielectric bonding, which may be fusion bonding, for example, with Si—O—Si bonds generated. The bonding may be performed by contacting the dielectric bonding layer 652 to the dielectric bonding layer 152 and the bond pads 654 to the bond pads 154. The device is then annealed to form bonds between the dielectric bonding layers 152 and 652 and metal inter-diffusion between the bond pads 154 and 654. The bonding may be performed at the same time as the hybrid bonding of the device die 205, described above with respect to FIG. 6, or may be performed in a separate process.

Figure 17:
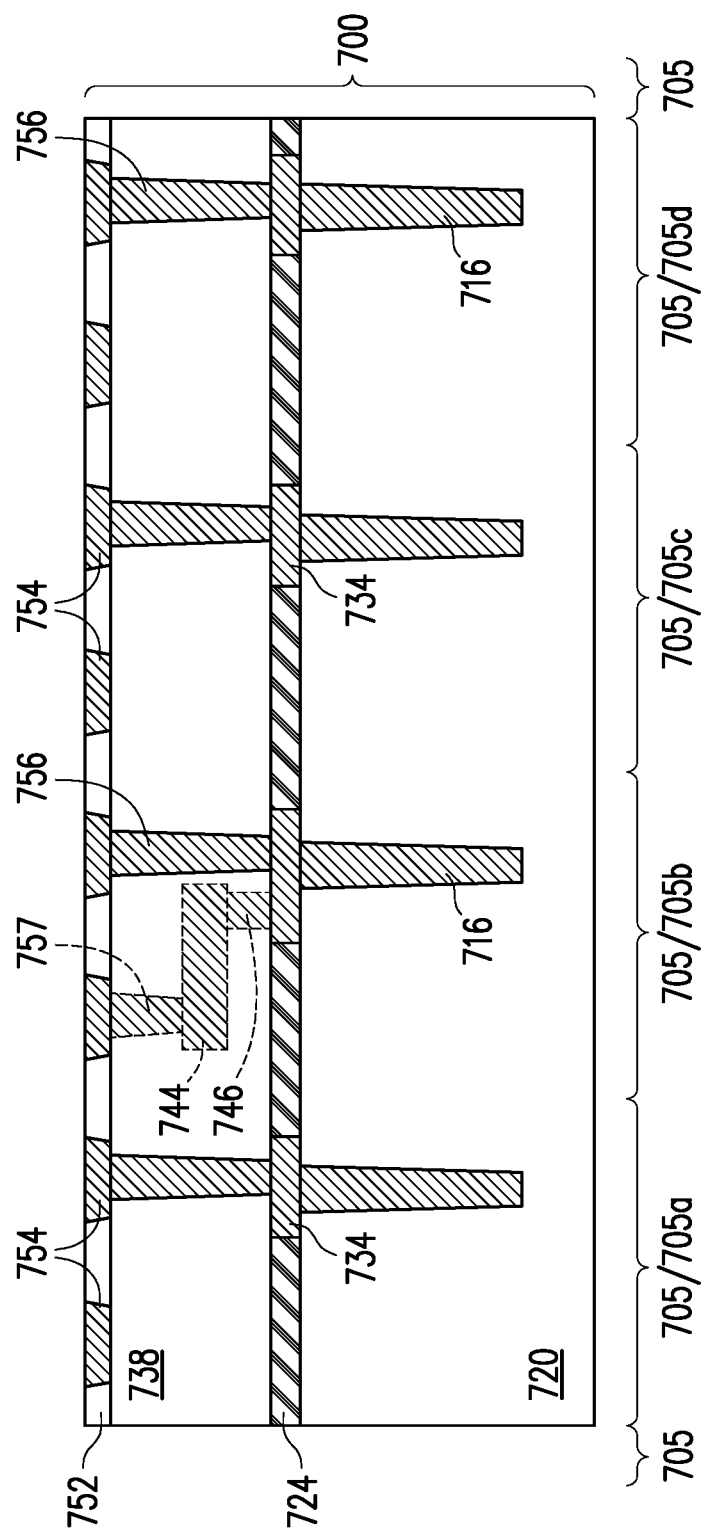

FIG. 17 illustrates the wafer 700 with multiple inactive structures 705 defined within, in accordance with some embodiments. The wafer 700 includes semiconductor substrate 720, which may be formed from the same candidates of materials described above with respect to semiconductor substrate 120 of FIG. 3. In particular, the semiconductor substrate 720 may be formed from the same material as semiconductor substrate 220 of FIG. 4.

In some embodiments, Through-Silicon Vias (TSVs) 716, sometimes referred to as through-semiconductor vias or through-vias, are formed to penetrate into the semiconductor substrate 720 (and eventually through the semiconductor substrate 720 by revealing from the opposite side). TSVs 716 may be used to electrically couple the metal lines or metal features formed on the front side (the illustrated top side) of the inactive structure 705 to the backside of the inactive structure 705. In a subsequent step, the backside of semiconductor substrate 720 may be recessed to reveal the TSVs 716. The TSVs 716 may be formed using processes and materials similar to those used to form the bond pad vias 216, discussed above, and are not repeated, including for example, using a time-based etching process so that the TSVs 716 may have a bottom which is disposed between the top surface and the bottom surface of the semiconductor substrate 720.

The TSVs 716 may further reduce the amount of warpage by providing heat dissipation from the device die 105 through the inactive structure 705. In some embodiments, electrical signals may also be routed through the inactive structure 705 by way of the TSVs 716.

In some embodiments, a tensile film 724 is formed over the semiconductor substrate 720 and over the TSVs 716. The tensile film 724 may be formed of the same processes and materials described above with respect to the tensile film 424 of FIG. 11. In other embodiments, the film 724 is a dielectric material, such as an ILD material, which may be formed using processes and materials such as those discussed above with regard to ILD 124 of FIG. 3.

Metal lines 734 may be formed in the tensile film 724, in accordance with some embodiments. The metal lines may be formed using processes and materials similar to those discussed above with respect to the metal lines 534 of FIG. 13. The metal lines 734 may be formed to electrically and physically couple to the TSVs 716.

A dielectric layer 738 may be formed over the tensile film 724. In some embodiments, vias 746 and metal features 744 may be formed in the dielectric layer 738, while in other embodiments, the vias 746 and metal features 744 are not formed. The vias 746 may be formed to contact the metal lines 734. The dielectric layer 738, vias 746, and metal features 744 may be formed using processes and materials similar to like structures (dielectric layer 538, vias 546, and metal features 544) of FIG. 13.

Bond pad vias 756 may be formed in the dielectric layer 738. In some embodiments, bond pad vias 757 may also or instead be formed to land on the metal features 744. The bond pad vias 756 and/or bond pad vias 757 may be formed using processes and materials similar to those discussed above with respect to the bond pad vias 156 and bond pad vias 157 of FIG. 3.

The dielectric bonding layer 752 is formed over the dielectric layers 738 and over the bond pad vias 756 and/or 757. The dielectric bonding layer 752 may be formed using materials and processes similar to those discussed above with respect to dielectric bonding layer 152 of FIG. 3.

Bond pads 754 may be formed in the dielectric bonding layer 752 using processes and materials similar to those discussed above with respect to the bond pads 154 of FIG. 3. As noted above, in some embodiments, the bond pads 754 may be formed simultaneously with the bond pad vias 756 and/or 757.

The bond pads 754 and bond pad vias 756 and/or 757 may be used to provide a thermal connection between the TSVs 716 and the bond pads 754. When the bond pads 754 are subsequently bonded to the device die 105, heat generated from active devices in the device die 105 may be dissipated through the bond pads 754 through the inactive structure 705 to the TSVs 716. In some embodiments, the bond pads 754 may also route electrical signals from the device die 105 through the inactive structure 705. For example, in some embodiments, a through via (e.g., through via 170 of FIG. 28) may be formed in a subsequently formed gap fill material (e.g., gap fill dielectric layer 162 of FIG. 28). In addition to or instead of forming a through via in the gap fill material, the inactive structure 705 can be used to form such through vias, thereby eliminating the need to form such through vias later.

Figure 18:
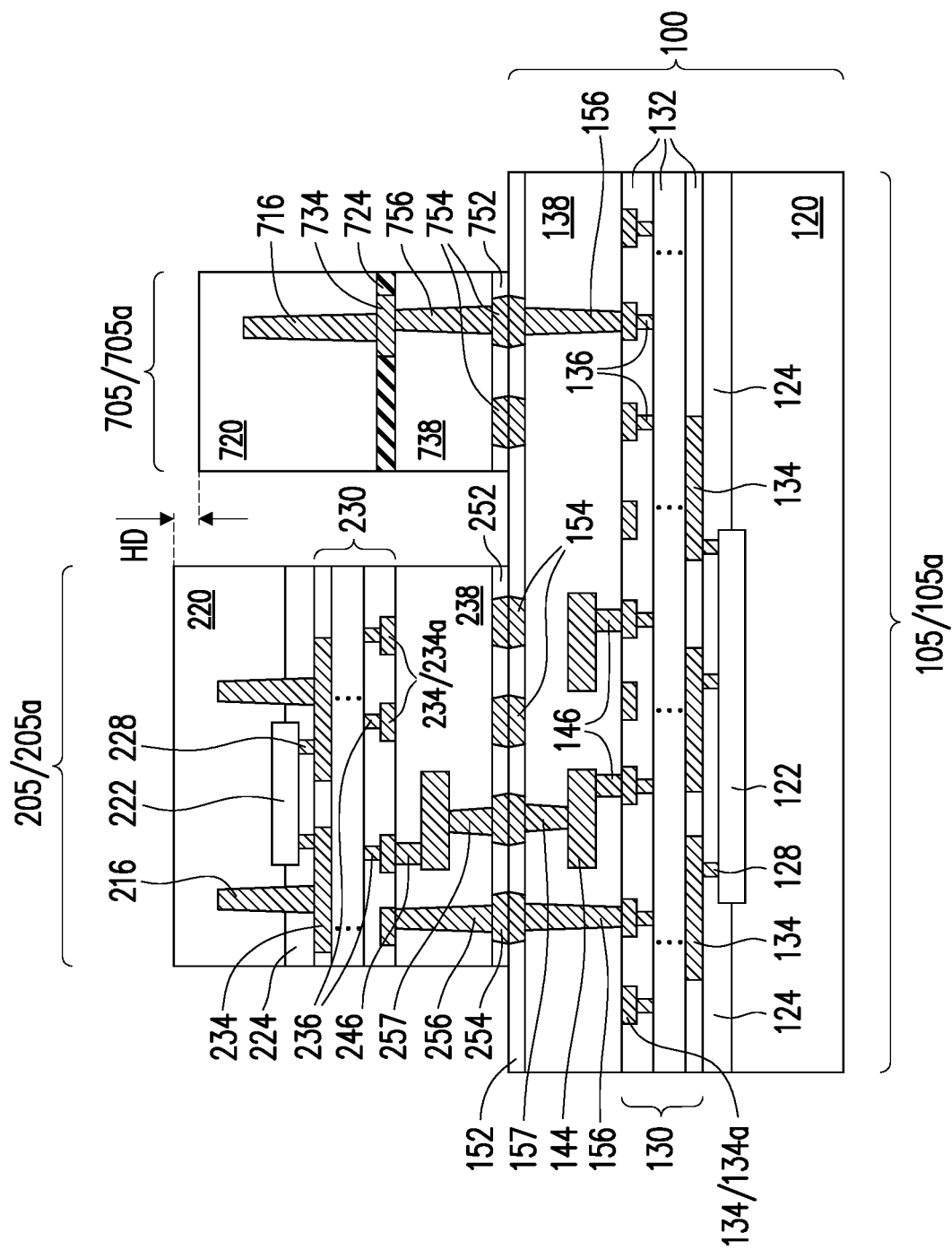

In FIG. 18, an inactive structure 705, such as the inactive structure 705a is bonded to the device die 105 through hybrid bonding, using processes similar to those described above with respect to FIG. 6. Corresponding bond pads 154 may be disposed in the device die 105 for the metal-to-metal bonding with the bond pads 754. Likewise, the dielectric bonding layer 752 is bonded to the dielectric bonding layer 152 using dielectric-to-dielectric bonding, which may be fusion bonding, for example, with Si—O—Si bonds generated. The bonding may be performed by contacting the dielectric bonding layer 752 to the dielectric bonding layer 152 and the bond pads 754 to the bond pads 154. The device is then annealed to form bonds between the dielectric bonding layers 152 and 752 and metal inter-diffusion between the bond pads 154 and 754. The bonding may be performed at the same time as the hybrid bonding of the device die 205, described above with respect to FIG. 6, or may be performed in a separate process.

Figure 19:
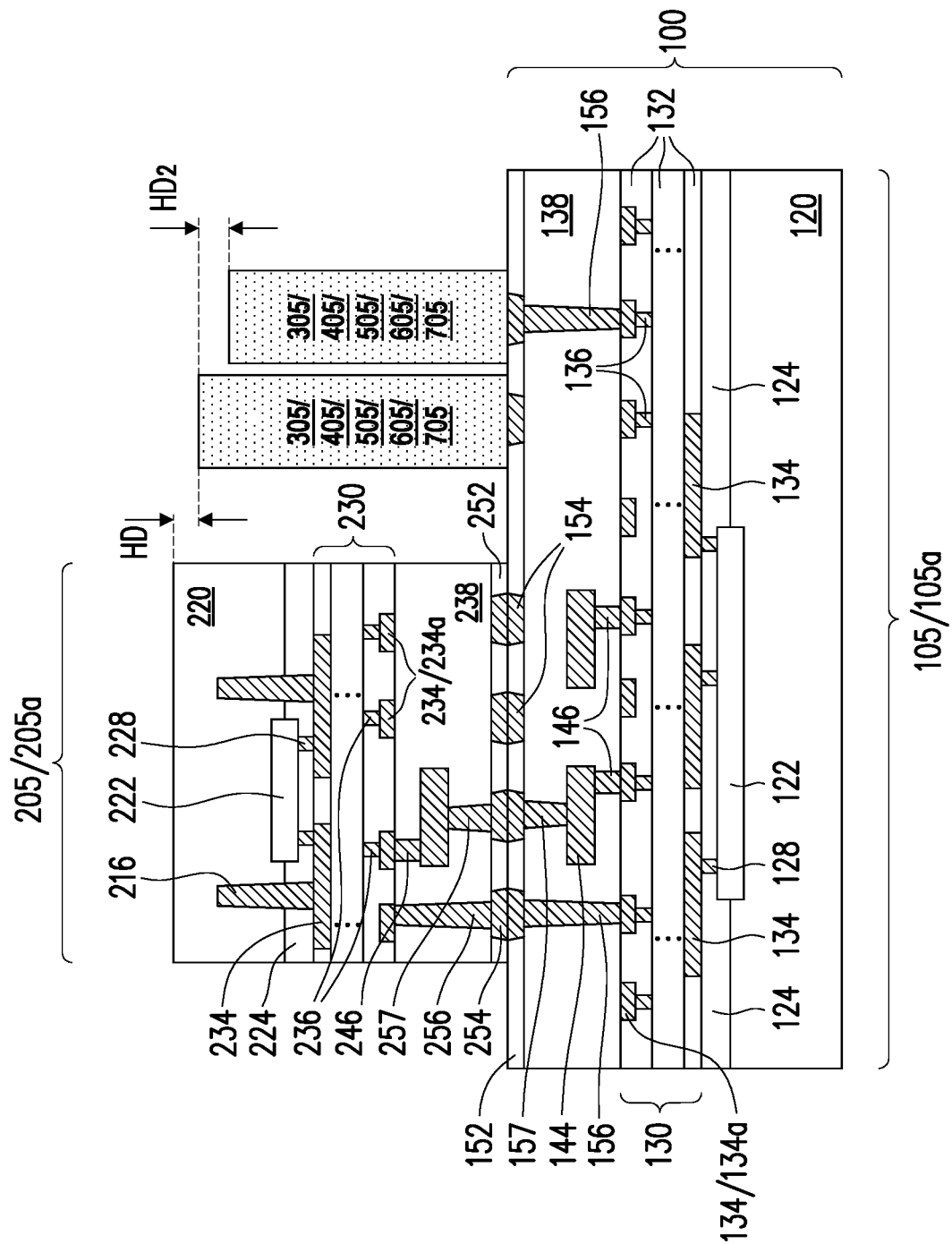

FIG. 19 illustrates an intermediate stage of forming a package device where multiple inactive structures 305, 405, 505, 605, and/or 705 may be used in the same package device, in accordance with some embodiments. The inactive structures may be any combination of any variation of the herein described inactive structures 305, 405, 505, 605, and 705. The inactive structures 305, 405, 505, 605, and/or 705 may have different sizes and heights, depending on the sizes of the gaps 302 (see FIG. 6). In some embodiments the heights may vary from one inactive structure to another by a difference of $HD_2$, which may be between about 0 μm and about 200 μm.

Figure 20:
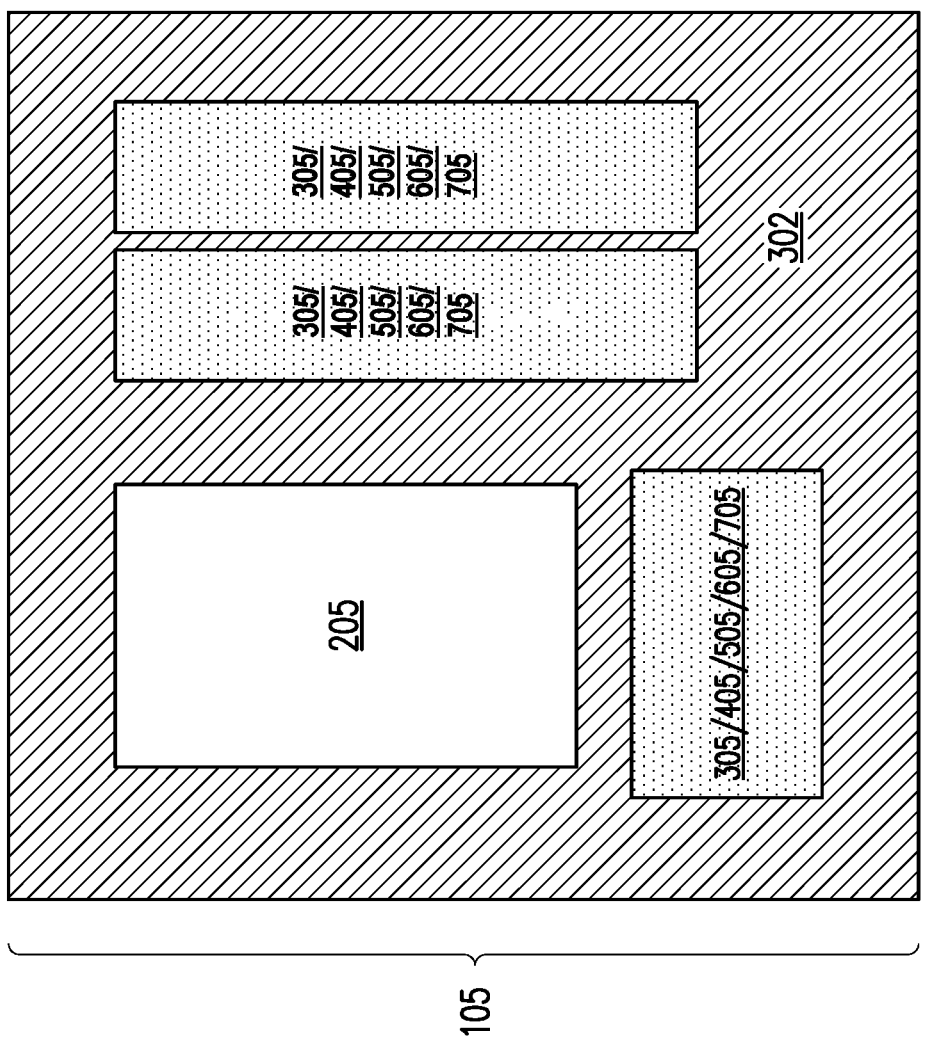

FIG. 20 is a top down view (i.e., plan view) of the intermediate stage of FIG. 19, further illustrating multiple inactive structures 305, 405, 505, 605, and/or 705. It should be appreciated that the illustrated layout is only an example and any size (i.e., footprint) inactive structure 305, 405, 505, 605, and/or 705 may be used to fill in the gaps 302 so that the combined area of the active devices attached to device die 105 (for example, device die 205) plus the combined area of the inactive structures attached to the device die 105 is more than 50% of the total area of the device die 105. In other words, the combined area of the inactive structures and active structures is greater than the total area of the gap 302.

FIG. 20 illustrates an intermediate stage of forming a package device where multiple inactive structures 305, 405, 505, 605, and/or 705 may be used in the same package device, in accordance with some embodiments. In embodiments consistent with that illustrated in FIG. 20, one or more of the inactive structures 305, 405, 505, 605, and/or 705 may span from one device die 105 to an adjacent device die 105 in the wafer 100. For example, as illustrated in FIG. 20, the inactive structure 305, 405, 505, 605, and/or 705 is illustrated as spanning the device die 105a and the device die 105b. The dicing line 106 traverses the inactive structure 305, 405, 505, 605, and/or 705.

Such embodiments can provide more flexibility on positioning the inactive structures 305, 405, 505, 605, and/or 705. When the wafer 100 is singulated in a subsequent process to separate the device die 105a from the device die 105b, the singulation process can also cut through the inactive structures 305, 405, 505, 605, and/or 705 so that one part of the inactive structure remains attached to device die 105a and another part remains attached to device die 105b. In some embodiments, the inactive structures 305, 405, 505, 605, and/or 705 may be positioned in a corner of the device die 105 and overlap to three other device dies 105.

Figure 21:
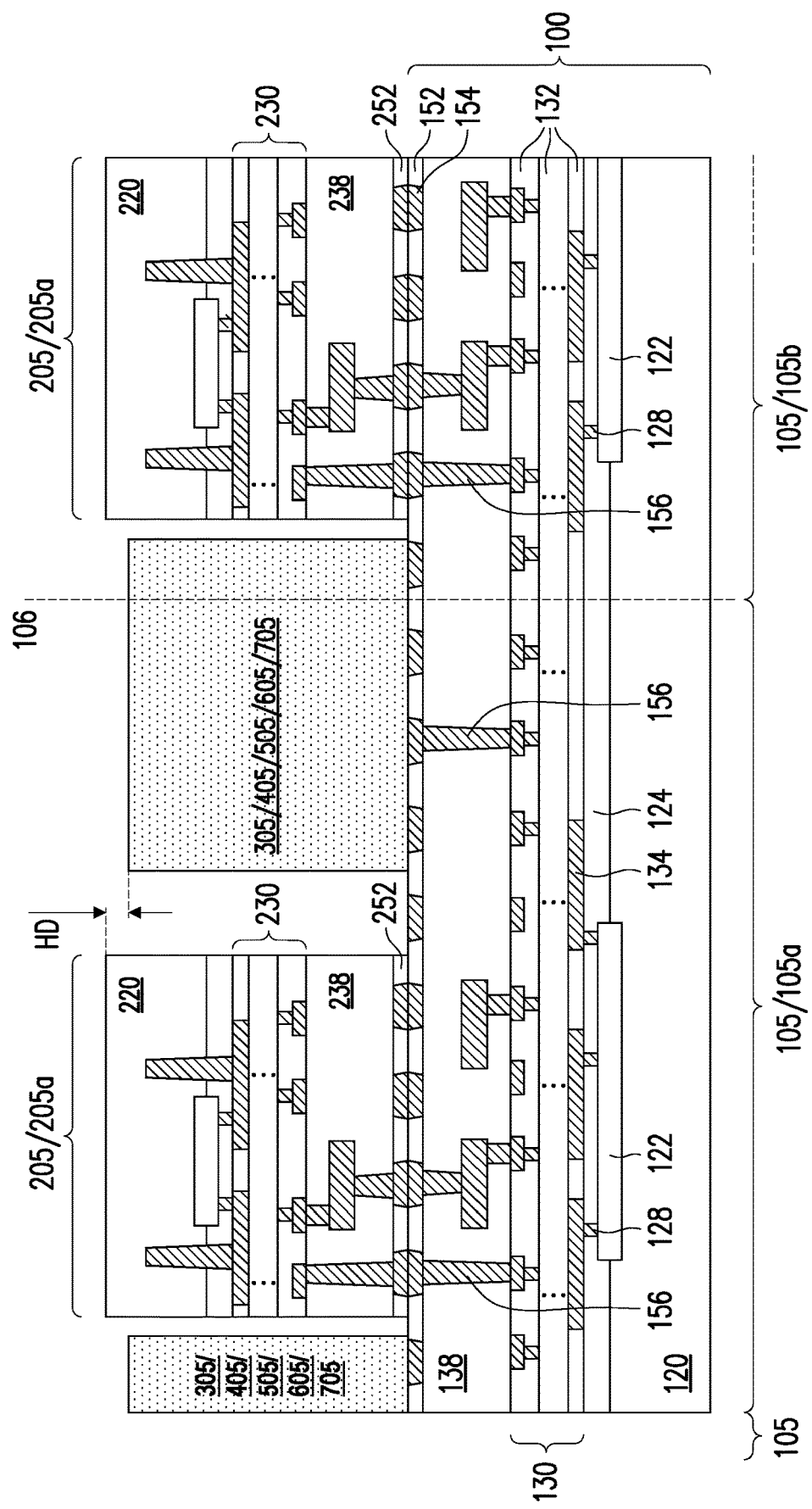
Figure 22:
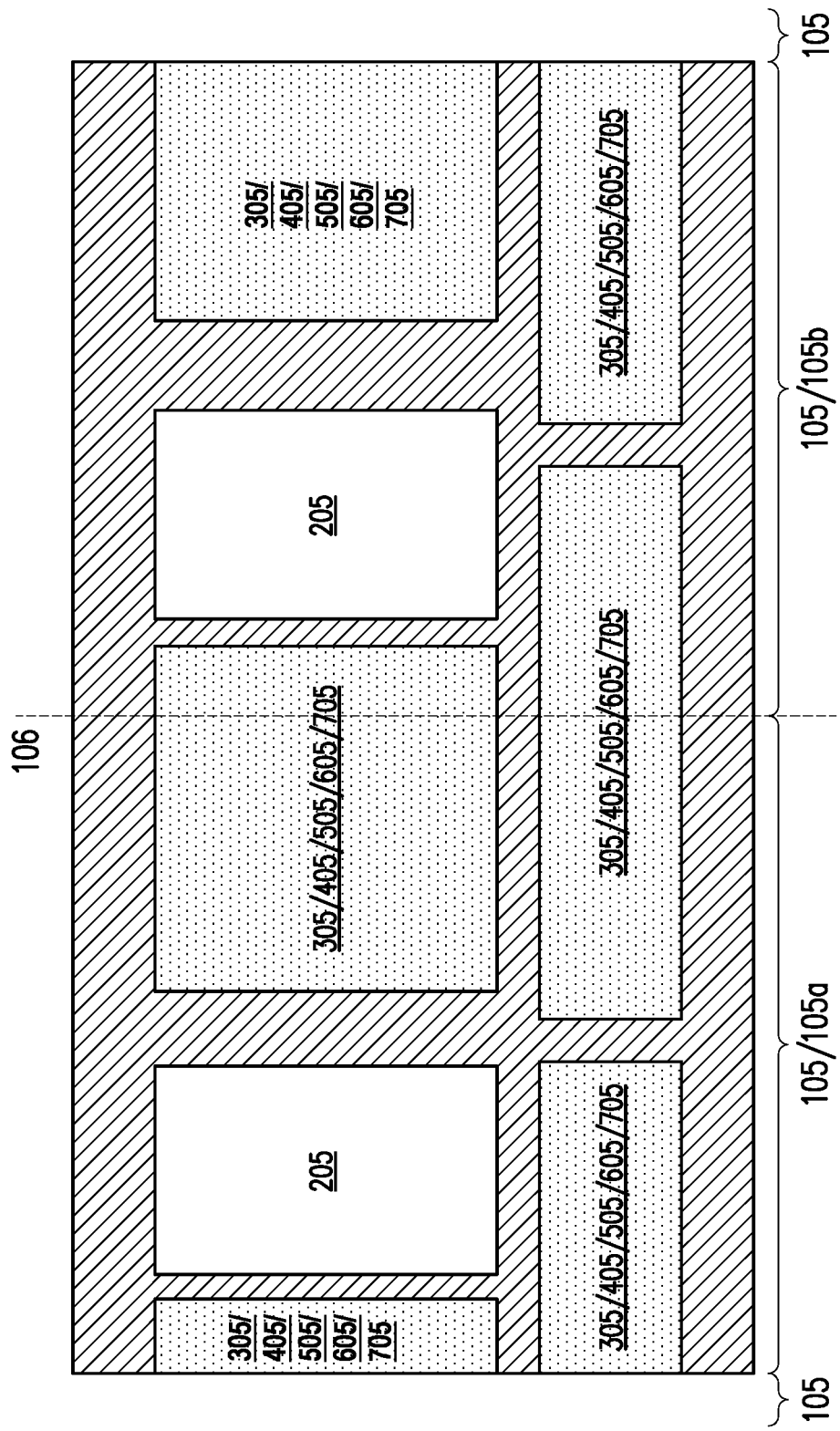

FIG. 22 is a top down view (i.e., plan view) of the intermediate stage of FIG. 21, further illustrating multiple inactive structures 305, 405, 505, 605, and/or 705 spanning multiple device dies 105. As illustrated in FIG. 22, the dicing line 106 traverses the inactive structures 305, 405, 505, 605, and/or 705 which span multiple device dies 105. It should be appreciated that inactive structures 305, 405, 505, 605, and/or 705 may also be included which do not span multiple device dies 105.

FIGS. 23 through 28 illustrate intermediate steps in continuing the flow for forming a package device including a device die 105, one or more device dies 205, and one or more inactive structures 305, 405, 505, 605, and/or 705.

Figure 23:
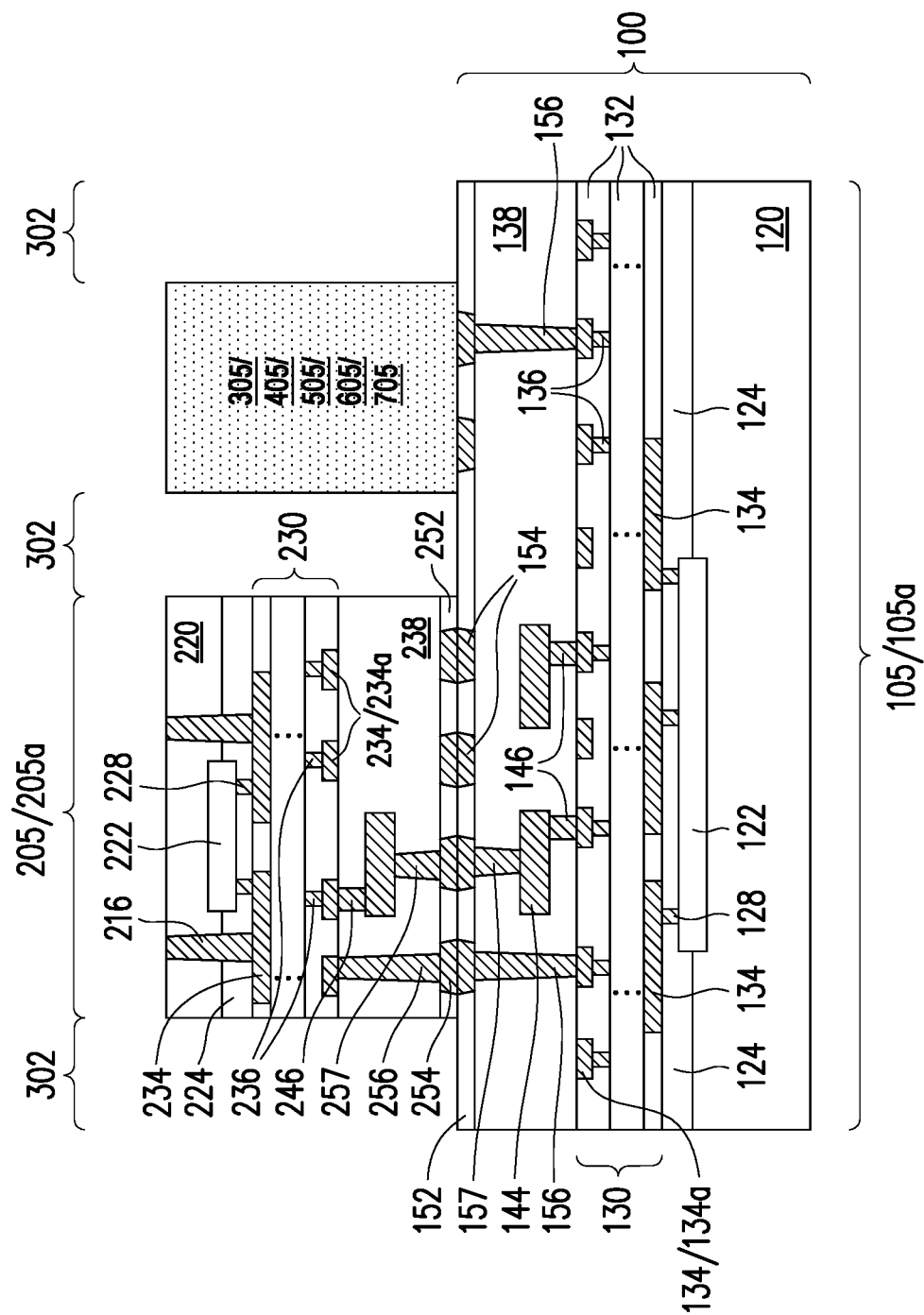
FIGS. 23 through 28 illustrate intermediate steps for forming a package device including a first device die, one or more second device dies attached thereto, and one or more inactive structures also attached thereto, in accordance with some embodiments.

In FIG. 23, in accordance with some embodiments, after the bonding process of bonding the device die(s) 205 and inactive structure(s) 305, 405, 505, 605, and/or 705 to the device die 105, a backside grinding may be performed to thin device dies 205 and inactive structures 305, 405, 505, 605, and/or 705, for example, to a thickness between about 5 μm and about 30 μm. The thinning also reduces the aspect ratio of the gaps 302 to aid in gap filling. The thinning may also make the heights of the device dies 205 the same as the heights of the inactive structures 305, 405, 505, 605, and 705. After the backside grinding, TSVs 216 and TSVs 716 (if applicable) may be revealed. Alternatively, TSVs 216 (and TSVs 716) are not revealed yet, and the backside grinding is stopped prior to uncovering the TSVs 216 (and TSVs 716). In some embodiments, the backside grinding may be performed after the gap fill material is deposited and may optionally be omitted at this time, for example, if the aspect ratio is sufficient to achieve the gap fill.

Figure 24:
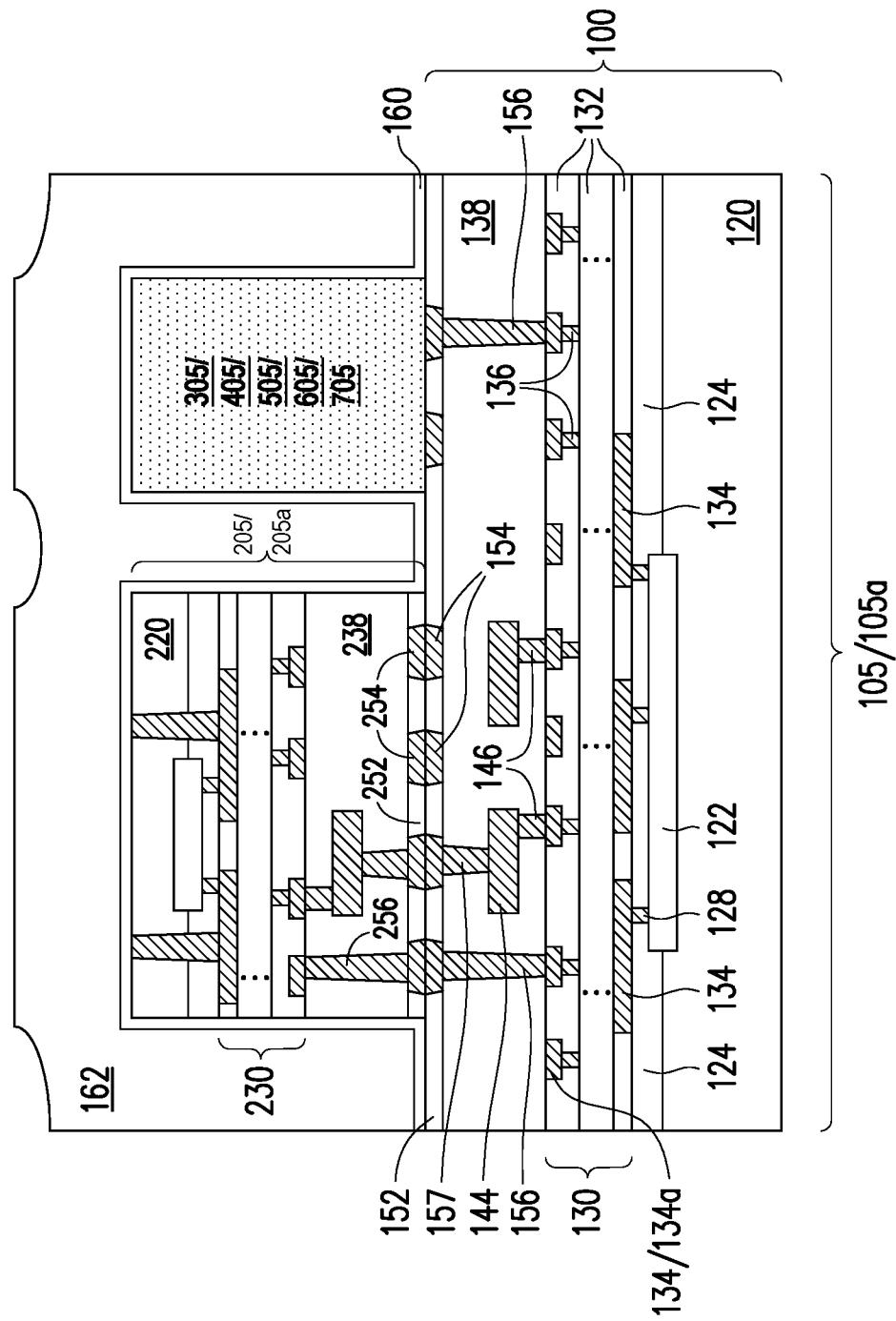

FIG. 24 illustrates the formation of gap-filling layers, which includes dielectric layer 162 and the underlying etch stop layer 160. Etch stop layer 160 is formed of a dielectric material that has a good adhesion to the sidewalls of device dies 205, the inactive structures 305, 405, 505, 605, and/or 705, and the top surfaces of dielectric bonding layer 152 and bond pads 154. In accordance with some embodiments of the present disclosure, etch stop layer 160 is formed of a nitride-containing material such as silicon nitride. Etch stop layer 160 may be a conformal layer, for example, with the thickness of horizontal portions and thickness of the vertical portions being substantially equal to each other, for example, with the difference having an absolute value smaller than about 20 percent, or smaller than about 10 percent, of both thicknesses. The deposition may include a conformal deposition method such as Atomic Layer Deposition (ALD) or Chemical Vapor Deposition (CVD).

Dielectric layer 162 is formed of a material different from the material of etch stop layer 160. In accordance with some embodiments of the present disclosure, dielectric layer 162 is formed of silicon oxide, which may be a TEOS formed silicon oxide, while other dielectric materials such as silicon carbide, silicon oxynitride, silicon oxy-carbo-nitride, PSG, BSG, BPSG, or the like may also be used. Dielectric layer 162 may be formed using CVD, High-Density Plasma Chemical Vapor Deposition (HDPCVD), Flowable CVD, spin-on coating, or the like. Dielectric layer 162 fully fills the remaining gaps 302 (FIG. 23).

Figure 25:
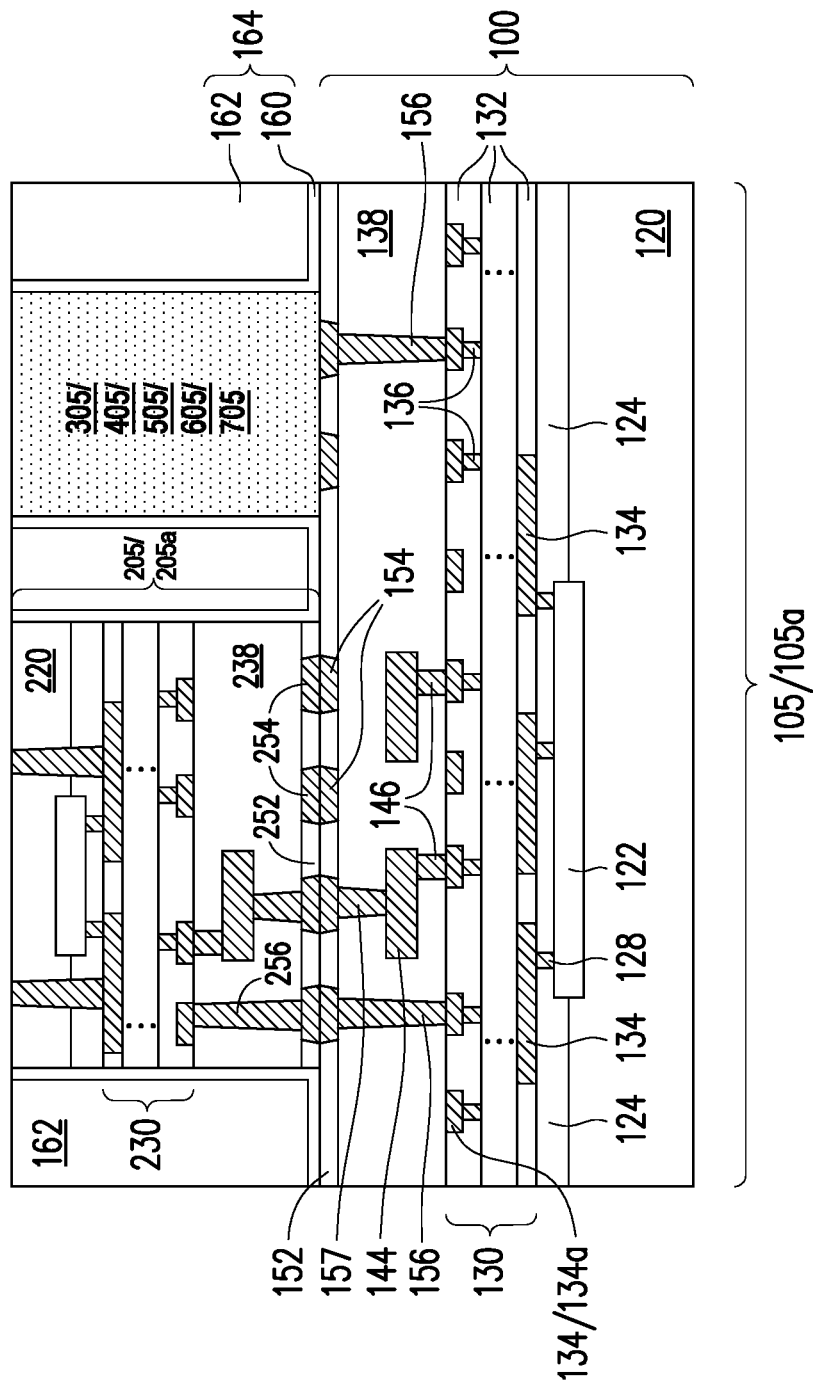

Referring to FIG. 25, a planarization process such as a CMP process or a mechanical grinding process is performed to remove excess portions of gap-filling layers 160 and 162, so that device dies 205 and inactive structures 305, 405, 505, 605, and/or 705 are exposed. Also, TSVs 216 (and 716, if applicable) are exposed. The dielectric layer 162 and etch stop layer 160 together may be referred to as the gap-fill material 164.

Figure 26:
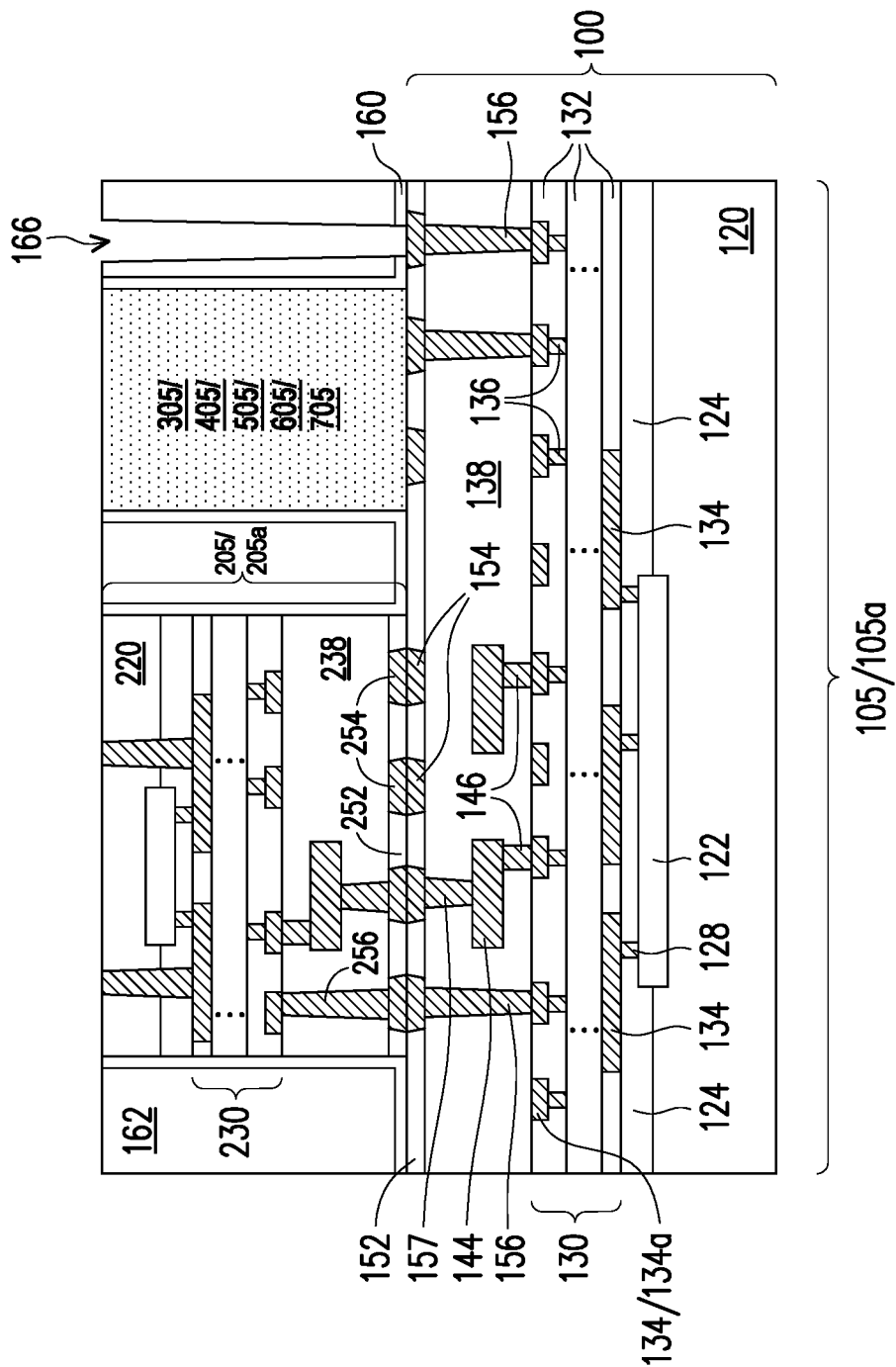

FIG. 26 illustrates the etching of dielectric layer 162 to form openings 166 for optional through-vias through the gap-fill material 164. In accordance with some embodiments of the present disclosure, a photo resist (not shown) is formed and patterned, and dielectric layer 162 is etched using the patterned photo resist as an etching mask. Openings 166 are thus formed, and extend down to etch stop layer 160, which acts as the etch stop layer. In accordance with some embodiments of the present disclosure, dielectric layer 162 comprises an oxide, and the etching may be performed through dry etching. The etching gas may include a mixture of $NF_3$ and $NH_3$, or a mixture of HF and $NH_3$. Next, etch stop layer 160 is etched, so that openings 166 extend down to bond pads 154. In accordance with some embodiments of the present disclosure, etch stop layer 160 is formed of silicon nitride, and the etching is performed using dry etching. The etching gas may include a mixture of $CF_4$, $O_2$, and $N_2$, a mixture of $NF_3$ and $O_2$, $SF_6$, or a mixture of $SF_6$ and $O_2$.

Figure 27:
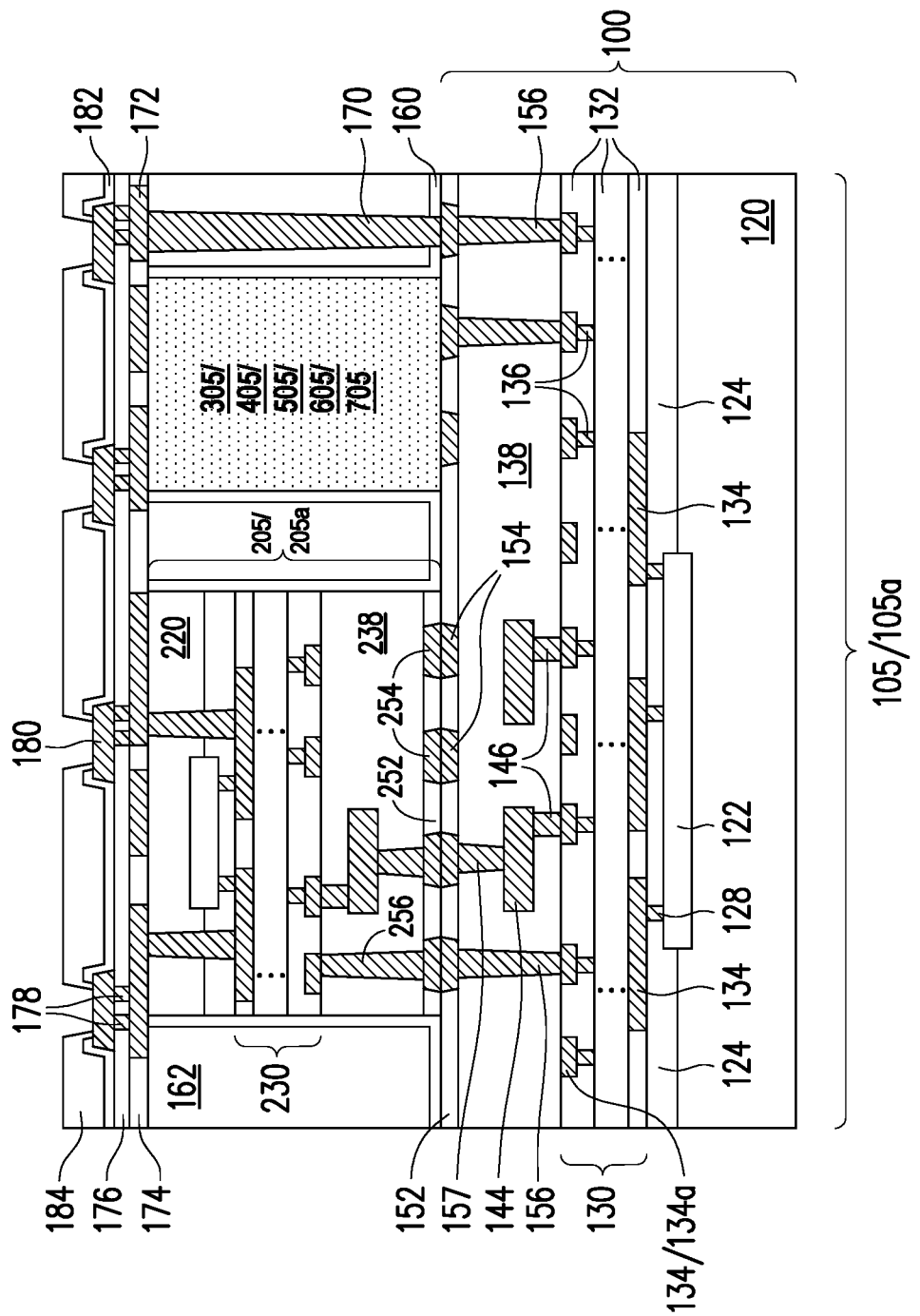

FIG. 27 illustrates the formation of through-vias 170, which fills openings 166 (FIG. 26), and are connected to bond pads 154. In accordance with some embodiments of the present disclosure, the formation of through-vias 170 includes performing a plating process such as an electrical-chemical plating process or an electro-less plating process. Through-vias 170 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form through-vias 170. Through-vias 170 may have substantially straight and vertical sidewalls. Also, through-vias 170 may have a tapered profile, with top widths slightly greater than the respective bottom widths.

In some embodiments, the inactive structure 705 may be used as a through-via. In some embodiments, TSVs 216 may be formed in device dies 205 using similar processes and materials as the through-vias 170. For example, either before or after the formation of openings 166 (FIG. 26), device dies 205 are etched to form additional openings (occupied by the illustrated TSVs 216). The additional openings in device dies 205 and openings 166 may be filled simultaneously to form through TSVs 216 and through-vias 170. The resulting TSVs 216 may have upper portions wider than the respective lower portions, opposite to what are shown in FIG. 27.

Redistribution lines (RDLs) 172 and dielectric layer 174 are formed of a redistribution structure. In accordance with some embodiments of the present disclosure, dielectric layer 174 is formed of an oxide such as silicon oxide, a nitride such as silicon nitride, or the like. RDLs 172 may be formed using a damascene process, which includes etching dielectric layer 174 to form openings, depositing a conductive barrier layer into the openings, plating a metallic material such as copper or a copper alloy, and performing a planarization to remove the excess portions of the metallic material.

FIG. 27 also illustrates the formation of passivation layers, metal pads, and overlying dielectric layers. Passivation layer 176 is formed over dielectric layer 174, and vias 178 are formed in passivation layer 176 to electrically connect to RDLs 172. Metal pads 180 are formed over passivation layer 176, and are electrically coupled to RDLs 172 through vias 178. Metal pads 180 may be aluminum pads or aluminum-copper pads, and other metallic materials may be used.

As also shown in FIG. 27, passivation layer 182 is formed over passivation layer 176. Each of passivation layers 176 and 182 may be a single layer or a composite layer, and may be formed of a non-porous material. In accordance with some embodiments of the present disclosure, one or both of passivation layers 176 and 182 is a composite layer including a silicon oxide layer (not shown separately), and a silicon nitride layer (not shown separately) over the silicon oxide layer. Passivation layers 176 and 182 may also be formed of other non-porous dielectric materials such as Un-doped Silicate Glass (USG), silicon oxynitride, and/or the like.

Next, passivation layer 182 is patterned, so that some portions of passivation layer 182 cover the edge portions of metal pads 180, and some portions of metal pads 180 are exposed through the openings in passivation layer 182. Polymer layer 184 is then formed, and then patterned to expose metal pads 180. Polymer layer 184 may be formed of polyimide, polybenzoxazole (PBO), or the like.

Figure 28:
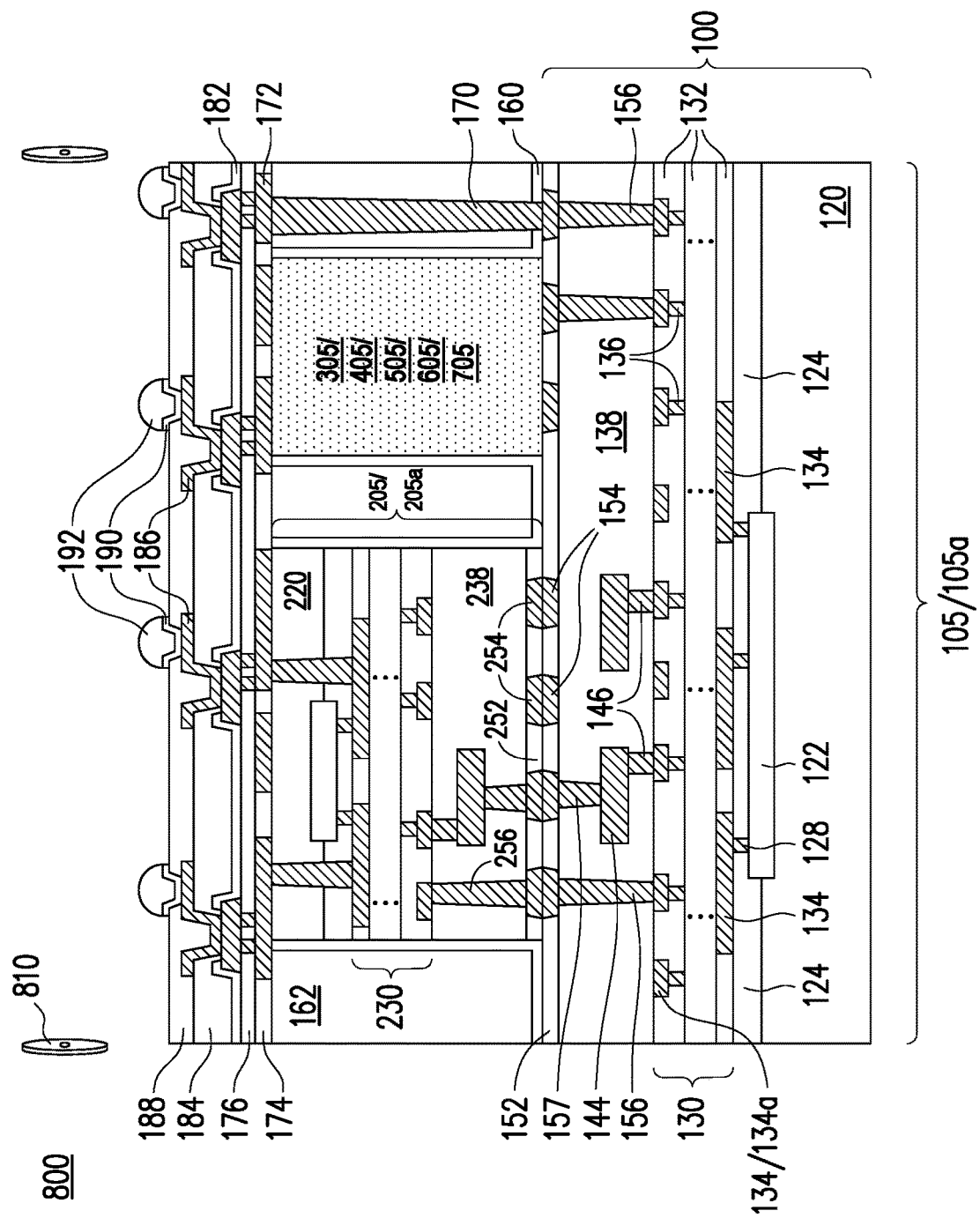

Referring to FIG. 28, Post-Passivation Interconnects (PPI) 186 are formed, which may include forming a metal seed layer and a patterned mask layer (not shown) over the metal seed layer, and plating PPIs 186 in the patterned mask layer. The patterned mask layer and the portions of the metal seed layer overlapped by the patterned mask layer are then removed in etching processes. Polymer layer 188 is then formed, which may be formed of PBO, polyimide, or the like.

Next, Under-Bump Metallurgies (UBMs) 190 are formed, and UBMs 190 extend into polymer layer 188 to connect to PPIs 186. In accordance with some embodiments of the present disclosure, each of UBMs 190 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 190. A formation process for forming UBMs 190 and electrical connectors 192 includes depositing a blanket UBM layer, forming and patterning a mask (which may be a photo resist, not shown), with portions of the blanket UBM layer being exposed through the opening in the mask. The exposed portions may then be removed by an etching process. Then the mask may be removed to reveal the UBMs 190.

As also shown in FIG. 28, electrical connectors 192 are formed. After the formation of UBMs 190, the illustrated package may be placed into a plating solution (not shown), and a plating step may be performed to form electrical connectors 192 on UBMs 190. In accordance with some embodiments of the present disclosure, electrical connectors 192 include non-solder parts (not shown), which are not molten in the subsequent reflow processes. The non-solder parts may be formed of copper, and hence are referred to as copper bumps hereinafter, although they may be formed of other non-solder materials. Each of electrical connectors 192 may also include cap layer(s) (not shown) selected from a nickel layer, a nickel alloy, a palladium layer, a gold layer, a silver layer, or multi-layers thereof. The cap layer(s) are formed over the copper bumps. The cap layers of electrical connectors 192 may include solder, which may be formed of a Sn—Ag alloy, a Sn—Cu alloy, a Sn—Ag—Cu alloy, or the like, and may be lead-free or lead-containing.

FIG. 28 also illustrates a singulation process, for example, using a die saw 810, though another suitable process may be used. The resulting structure is a package device 800.

Figure 29:
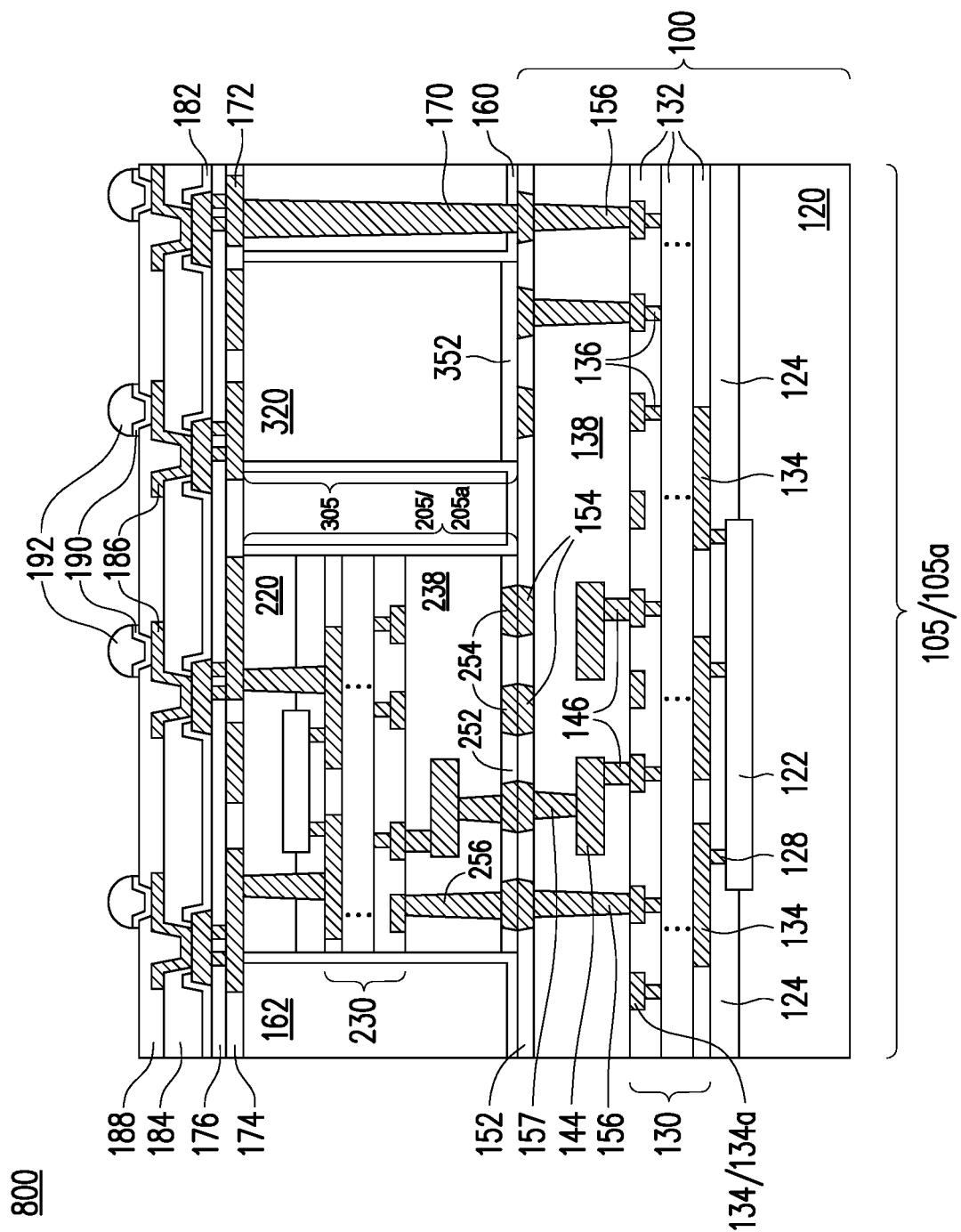

FIG. 29 illustrates the package device 800 having an inactive structure 305 disposed therein, in accordance with some embodiments. Other inactive structures 305, 405, 505, 605, and 705 may also be disposed therein. The inactive structure 305 may be formed and bonded to the device die 105 using the processes and materials described above with respect to FIGS. 9 through 10. The inactive structure 305 is a dummy structure and provides no electrical connection to the active devices 122 of the device die 105. The inactive structure 305 provides better warpage control in the package because the substrate 320 may have a similar CTE as the substrate 220 of the device die 205. The thermal conduction properties of the inactive structure 305 may be improved over the material of the gap fill dielectric layer 162, thereby providing better thermal dissipation for the device die 105.

Figure 30:
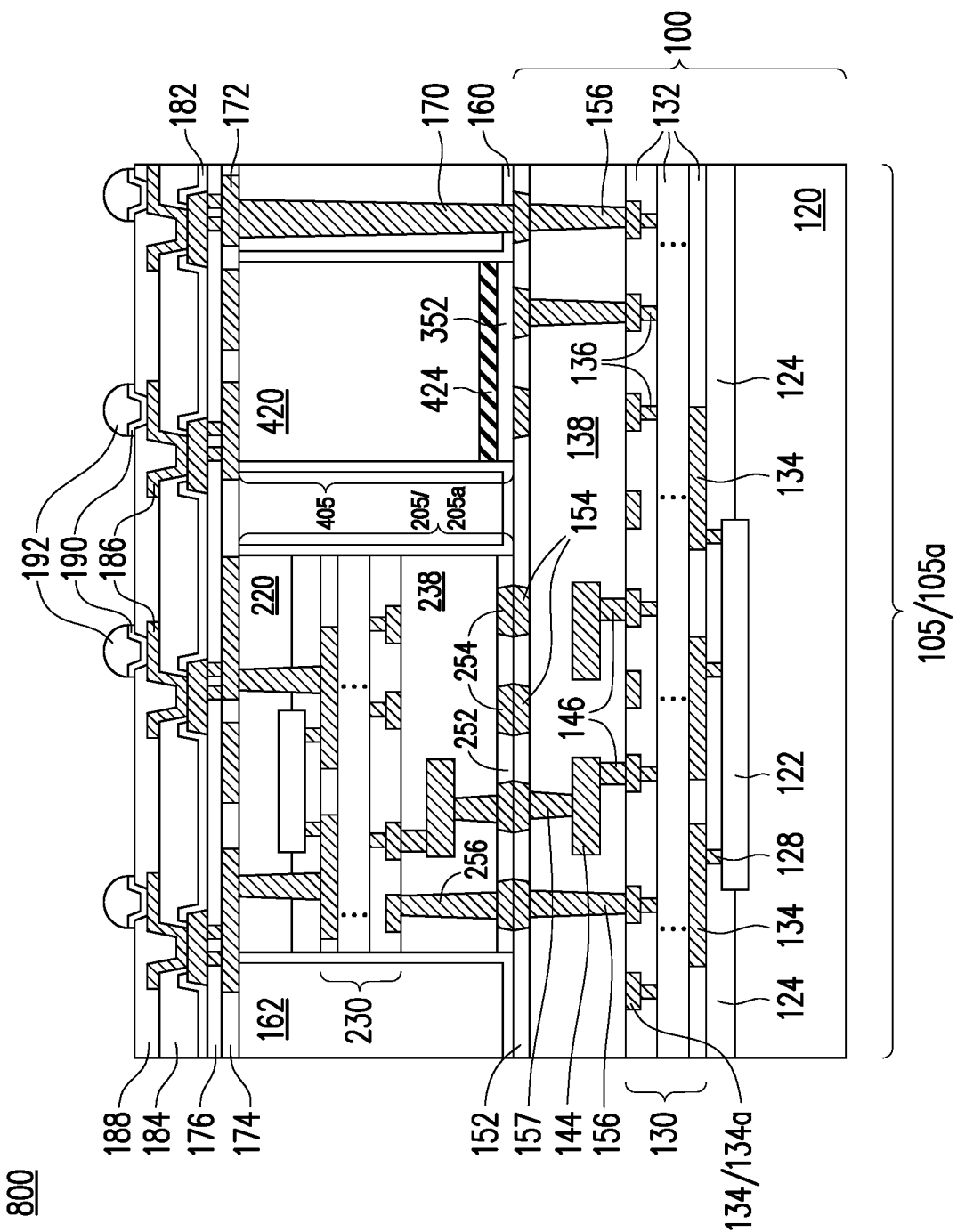

FIG. 30 illustrates the package device 800 having an inactive structure 405 disposed therein, in accordance with some embodiments. Other inactive structures 305, 405, 505, 605, and 705 may also be disposed therein. The inactive structure 405 may be formed and bonded to the device die 105 using the processes and materials described above with respect to FIGS. 11 through 12. The inactive structure 405 is a dummy structure and provides no electrical connection to the active devices 122 of the device die 105. The inactive structure 405 provides better warpage control in the package because the substrate 420 may have a similar CTE as the substrate 220 of the device die 205. In addition, the use of the tensile film 424 may help to resist warping. The thermal conduction properties of the inactive structure 405 may be improved over the material of the gap fill dielectric layer 162, thereby providing better thermal dissipation for the device die 105.

Figure 31:
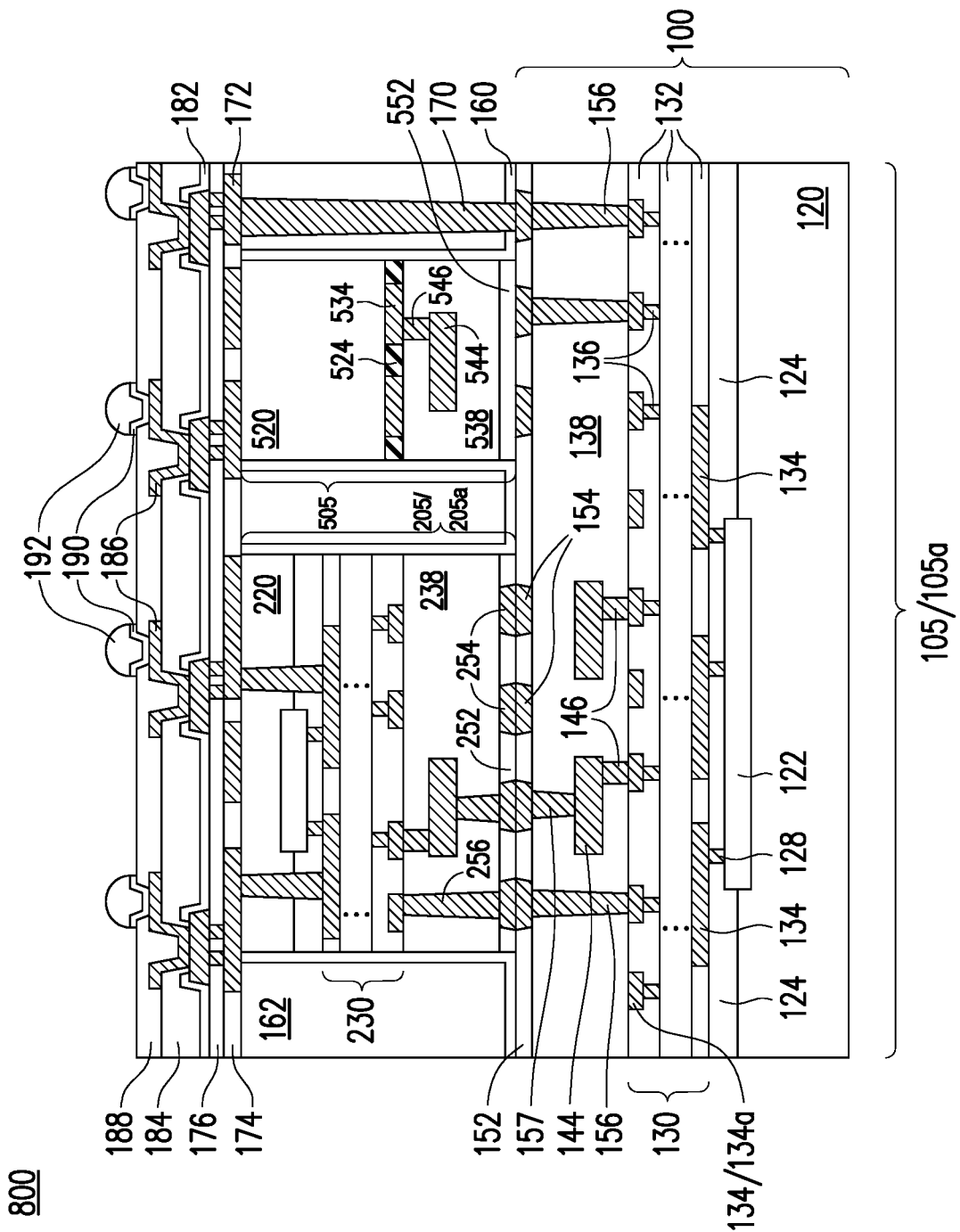

FIG. 31 illustrates the package device 800 having an inactive structure 505 disposed therein, in accordance with some embodiments. Other inactive structures 305, 405, 505, 605, and 705 may also be disposed therein. The inactive structure 505 may be formed and bonded to the device die 105 using the processes and materials described above with respect to FIGS. 13 through 14. The inactive structure 505 is a dummy structure and provides no electrical connection to the active devices 122 of the device die 105. The inactive structure 505 provides better warpage control in the package because the substrate 520 may have a similar CTE as the substrate 220 of the device die 205. In addition, the use of the tensile film 524, metal lines 534, vias 546, and metal features 544 may increase the tensile properties of the inactive structure 505 to help to resist warpage. The thermal conduction properties of the inactive structure 505 may be improved over the material of the gap fill dielectric layer 162, thereby providing better thermal dissipation for the device die 105. The metal lines 534, vias 546, and metal features 544 may also serve to increase the thermal conduction properties of the inactive structure 505.

Figure 32:
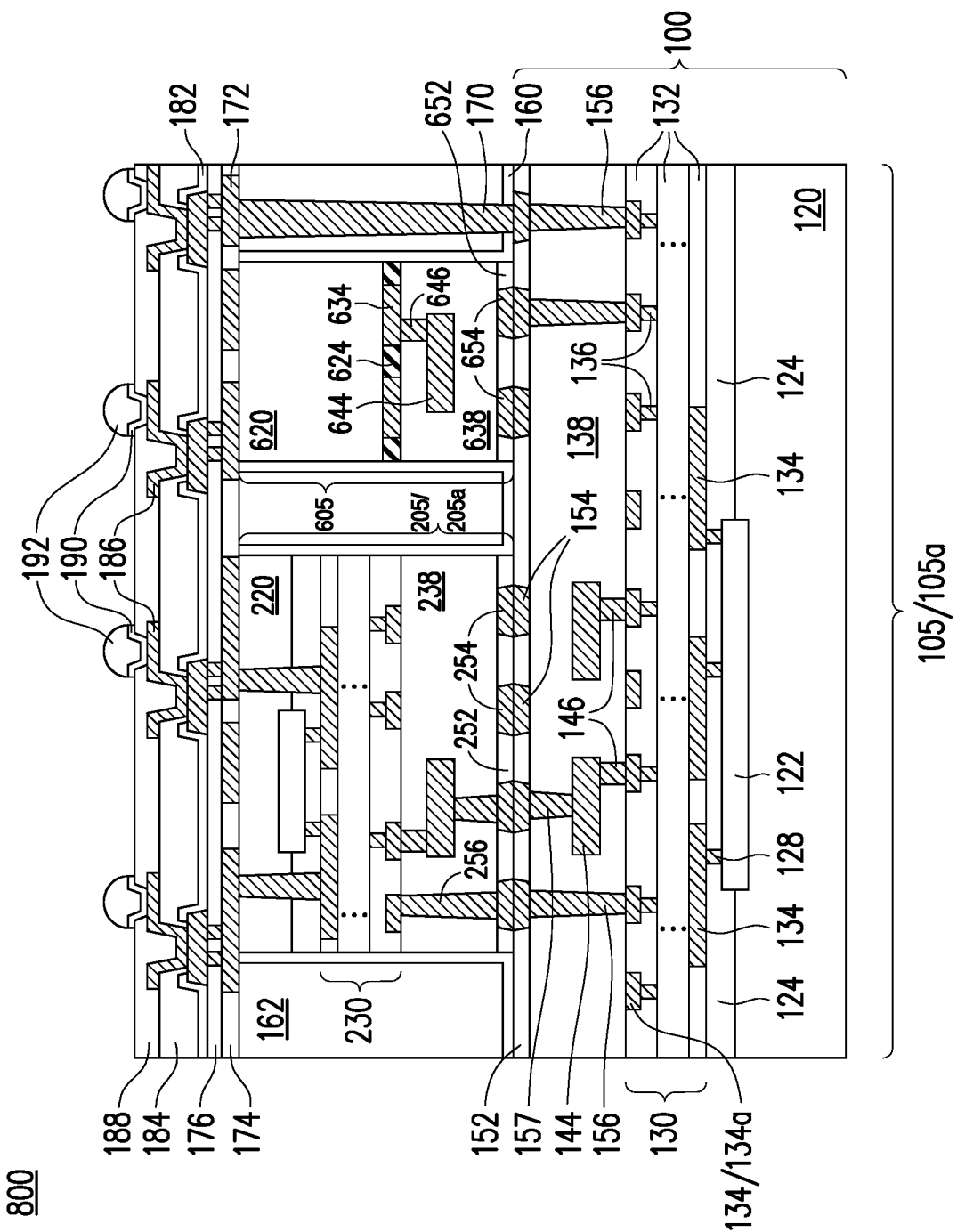

FIG. 32 illustrates the package device 800 having an inactive structure 605 disposed therein, in accordance with some embodiments. Other inactive structures 305, 405, 505, 605, and 705 may also be disposed therein. The inactive structure 605 may be formed and bonded to the device die 105 using the processes and materials described above with respect to FIGS. 15 through 16. In some embodiments, the inactive structure 605 is a dummy structure and provides no electrical connection to the active devices 122 of the device die 105. In other embodiments, the bond pads of the inactive structure 605 may electrically couple to the active devices 122 and, in some embodiments, may provide signal routing in the bond pad layer of the inactive structure 605. In some embodiments, signals are not routed through the inactive structure 605, and the inactive structure 605 is free from any electrical coupling to the active devices 122.

The inactive structure 605 provides better warpage control in the package because the substrate 620 may have a similar CTE as the substrate 220 of the device die 205. In addition, the use of the tensile film 624, metal lines 634, vias 646, metal features 644, and bond pads 654 may increase the tensile properties of the inactive structure 605 to help to resist warpage. The thermal conduction properties of the inactive structure 605 may be improved over the material of the gap fill dielectric layer 162, thereby providing better thermal dissipation for the device die 105. The metal lines 634, vias 646, metal features 644, and bond pads 654 may also serve to increase the thermal conduction properties of the inactive structure 605.

Figure 33:
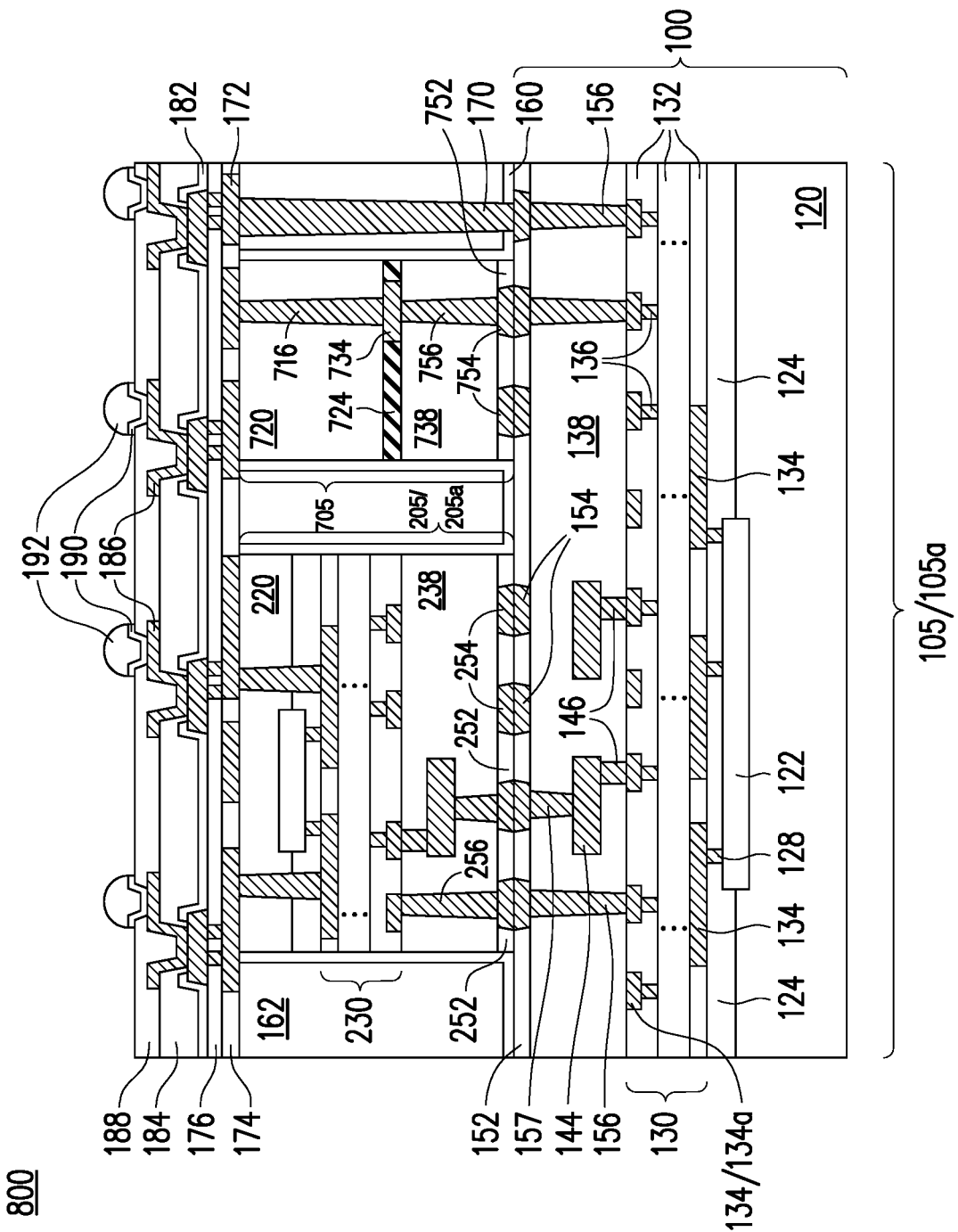

FIG. 33 illustrates the package device 800 having an inactive structure 705 disposed therein, in accordance with some embodiments. Other inactive structures 305, 405, 505, 605, and 705 may also be disposed therein. The inactive structure 705 may be formed and bonded to the device die 105 using the processes and materials described above with respect to FIGS. 17 through 18. In some embodiments, the inactive structure 705 is a dummy structure and provides no electrical connection to the active devices 122 of the device die 105. In other embodiments, the bond pads 754 of the inactive structure 705 may electrically couple to the active devices 122 and, in some embodiments, may provide signal routing in the bond pad layer or metal lines 734 of the inactive structure 705. In some embodiments, the TSVs 716, together with the metal lines 734, bond pad vias 756, and bond pads 754, may provide signal routing similar to a through-via, through the gap fill dielectric layer 162. In some embodiments, signals are not routed through the inactive structure 705, and the inactive structure 705 is free from any electrical coupling to the active devices 122.

The inactive structure 705 provides better warpage control in the package because the substrate 720 may have a similar CTE as the substrate 720 of the device die 705. In addition, the use of the tensile film 724, metal lines 734, bond pads 754, bond pad vias 756, and TSVs 716 may increase the tensile properties of the inactive structure 705 to help to resist warpage. The thermal conduction properties of the inactive structure 705 may be improved over the material of the gap fill dielectric layer 162, thereby providing better thermal dissipation for the device die 105. The bond pads 754, bond pad vias 752, metal lines 734, and TSVs 716 can provide an effective thermal bridge between the device die 105 and the overlying layers and may thus serve to increase the thermal conduction properties of the inactive structure 705.

Figure 34:
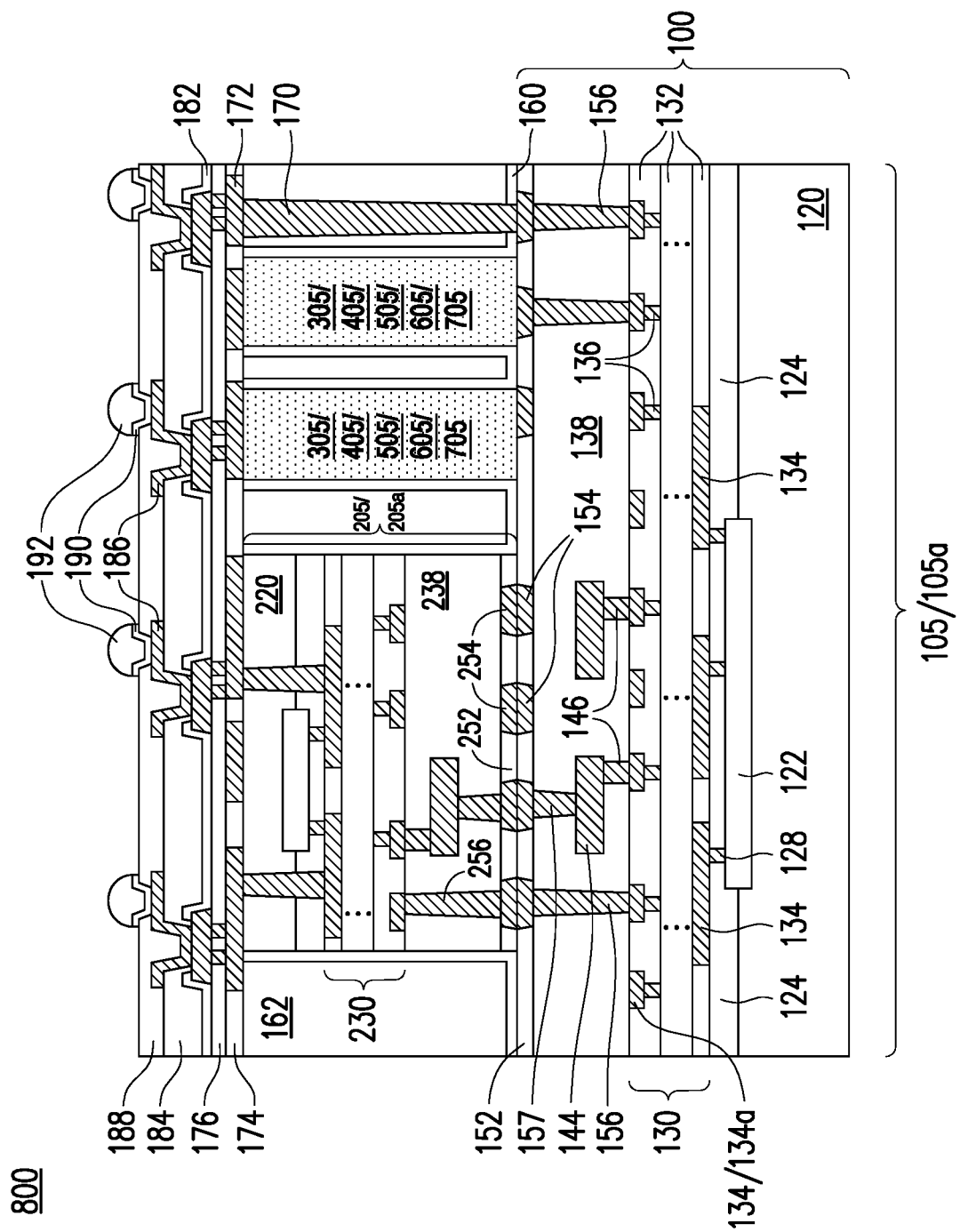

FIG. 34 illustrates the package device 800 having a combination of multiple inactive structures 305/405/505/605/705 disposed therein, in accordance with some embodiments. Other inactive structures 305, 405, 505, 605, and 705 may also be disposed therein. The inactive structures 305/405/505/605/705 may be formed and bonded to the device die 105 using the processes and materials described above with respect to FIGS. 9 through 18.

Figure 35:
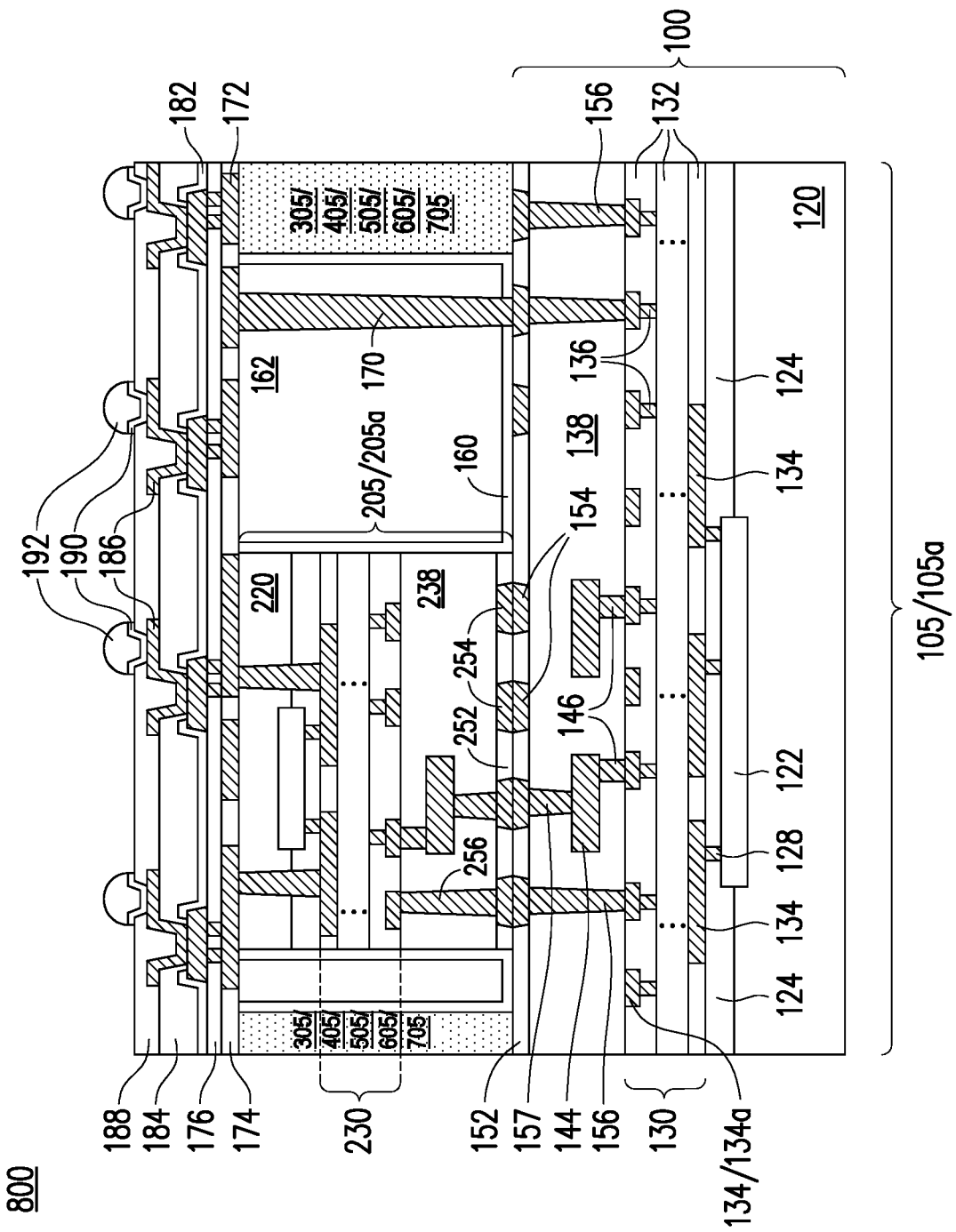

FIG. 35 illustrates the package device 800, in accordance with some embodiments. As discussed above (e.g., with respect to FIG. 21), the inactive structure(s) 305, 405, 505, 605, and/or 705 may span multiple device dies 105 so that the resulting package deice 800 has a sidewall which is made of a first portion of the inactive structure(s) 305, 405, 505, 605, and/or, 705. A matching second portion of the inactive structure(s) 305, 405, 505, 605, and/or 705 from a different inactive structure adjoining opposing sides of the device die 105 may be disposed at a sidewall opposite the first portion of the inactive structure.

Figure 36:
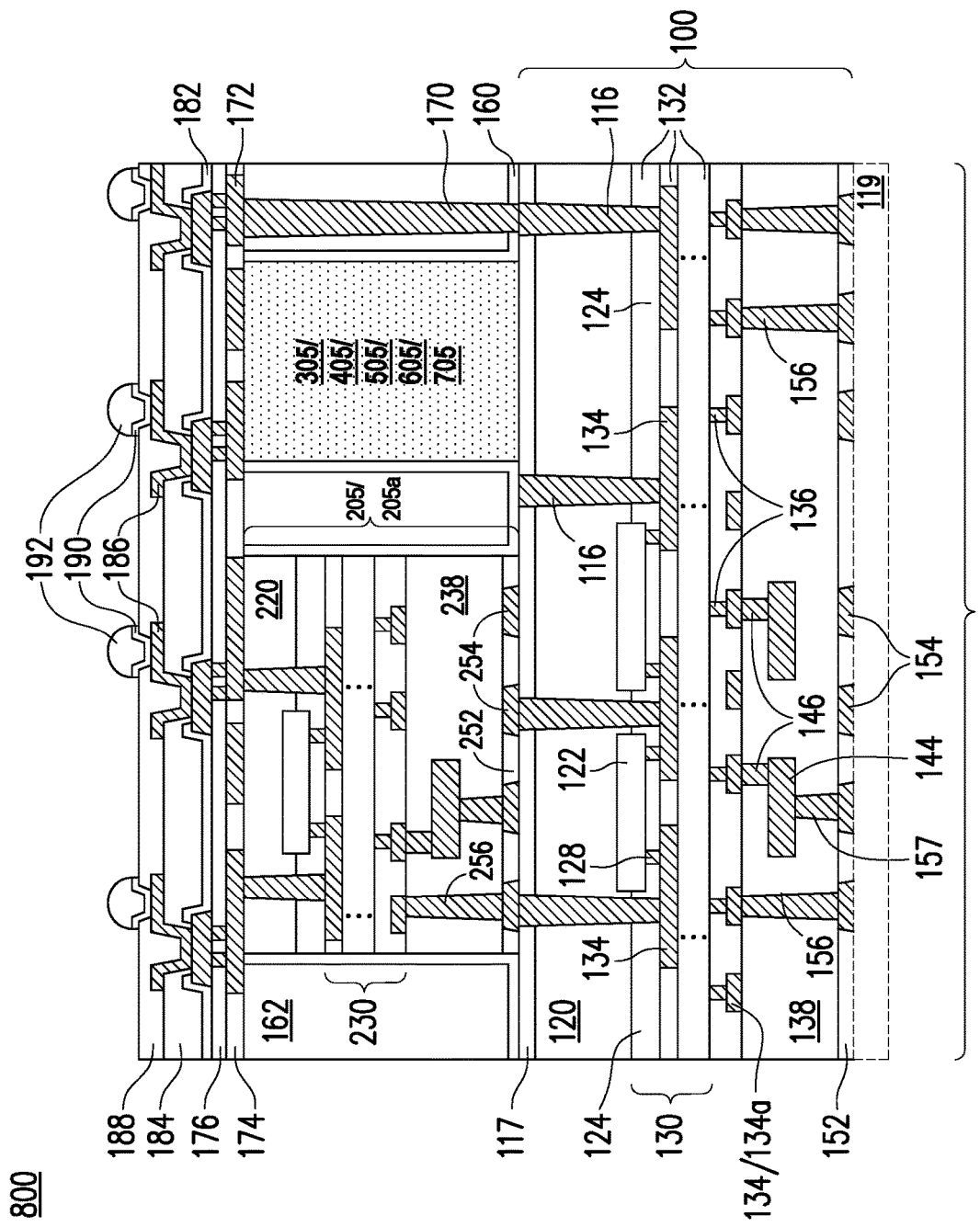

The package devices 800 illustrated in FIGS. 29 through 35 have a face-to-face structure, in which device dies 205 have their front surfaces facing the front surface of device die 105. FIGS. 36 and 37, however, illustrate face-to-back structures, in which device dies 205 have their front surfaces facing the back surface of device die 105. In each of FIGS. 36 and 37, device die 105 includes TSVs 116, which extend through semiconductor substrate 120 and dielectric bonding layer 117. FIG. 36 provides an illustration of face-to-back embodiments otherwise similar to those illustrated with respect to FIGS. 29 through 34 and FIG. 37 provides an illustration of a face-to-back embodiments otherwise similar to those illustrated in FIG. 35. The dashed region 119 in FIGS. 36 and 37 represents an area where a connect structure, such as that described above with respect to FIGS. 27 through 28, may be formed. In accordance with some embodiments of the present disclosure, the TSVs 116 and dielectric bonding layer 117 may be formed using processes and materials similar to the bond pad vias 156 of FIG. 3.

Embodiments of the present disclosure advantageously provide inactive structures to reduce the amount of gap fill material needed to surround an attached device die. When the cumulative area(s) of the attached device die(s) is less than half the area of the device die to which it is attached (e.g., device die 105), the CTE mismatch between the gap fill material and the attached device die(s) can cause too much warpage in the final package device. Hence, adding inactive structures to take the space where those inactive structures include material layers which are more similar to that of the attached device (i.e., a silicon substrate, metal features, etc.), as well as a tensile film, in some embodiments, a reduction in warpage is achievable.

One embodiment is a method including providing a first device die, the first device die may include an active device disposed therein, the first device die having a first surface area. The method also includes bonding a second device die to the first device die, the second device die having a second surface area less than one-half the first surface area. The method also includes bonding one or more inactive structures to the first device die, the one or more inactive structures having a cumulative third surface area, the second surface area and the cumulative third surface area together being greater than one-half the first surface area. The method also includes filling a gap laterally surrounding the second device die and the one or more inactive structures with a gap-fill material.

In an embodiment, the method may include forming a through-via in the gap- fill material. In an embodiment, bonding a first inactive structure of the one or more inactive structures to the first device die may include: placing the first inactive structure on the first device die; pressing the first inactive structure against the first device die; and annealing the combination of the first inactive structure and the first device die. In an embodiment, the first inactive structure overlaps a dicing line of the first device die and covers a portion of a third device die, the third device die adjacent the first device die. In an embodiment, the method may include: forming a redistribution structure over the gap-fill material; forming a connector structure over the redistribution structure; and singulating the first device die from a wafer to form a singulated device package including the first device die, the second device die, and at least a portion of the one or more inactive structures. In an embodiment, the singulating may include a cutting process, where the cutting process cuts through a first inactive structure of the one or more inactive structures. In an embodiment, bonding the second device die to the first device die may include: aligning second bond pads of the second device die to first bond pads of the first device die; pressing the second bond pads to the first bond pads; and annealing the second device die and first device die to interdiffuse a metallic material of the first bond pads with a metallic material of the second bond pads. In an embodiment, bonding the second device die is performed at the same time as bonding the one or more inactive structures to the first device die.

Another embodiment is a package device, including a first device die, the first device die having a first footprint, and a second device die bonded to the first device die, the second device die having a second footprint less than half the first footprint, the second device die including a semiconductor substrate. The package device also includes one or more inactive structures bonded to the first device die adjacent the second device die, where the one or more inactive structures may include a semiconductor substrate free of any active devices. The package device also includes a gap-fill material laterally surrounding the second device die and the one or more inactive structures. The package device also includes a connector structure disposed over the gap-fill material, the connector structure electrically coupled to the second device die.

In an embodiment, a first inactive structure of the one or more inactive structures may include: a semiconductor substrate; and a dielectric bonding layer, the dielectric bonding layer fused to a dielectric bonding layer of the first device die. In an embodiment, the first inactive structure may include a tensile film layer. In an embodiment, the first inactive structure may include a metallization layer. In an embodiment, the first inactive structure may include bond pads disposed in the dielectric bonding layer, the bond pads bonded to corresponding bond pads of the first device die without using a solder material. In an embodiment, the first inactive structure may include a through-via traversing a thickness of the semiconductor substrate, the through-via configured to disperse heat from the first device die. In an embodiment, the package device may include a first redistribution structure interposed between the gap-fill material and the connector structure; and a through-via disposed in the gap-fill material, the through-via electrically coupling a bond pad of the first device die to the first redistribution structure.

Another embodiment is a package device, including a first device die and a second device die bonded to the first device die. The package device also includes one or more inactive structures bonded to the first device die, where a cumulative area of the second device die and the one or more inactive structures is greater than 50% of an area of the first device die. The package device also includes a dielectric layer laterally surrounding the second device die and the one or more inactive structures. The package device also includes a connector structure disposed over the dielectric layer, the connector structure electrically coupled to the second device die.

In an embodiment, a first inactive structure of the one or more inactive structures may include a semiconductor substrate, a dielectric bonding layer, and one or more of: a tensile film, metal lines, bond pads disposed in the dielectric bonding layer, or through-vias disposed in the semiconductor substrate. In an embodiment, a first inactive structure of the one or more inactive structures has a first sidewall aligned to a sidewall of the first device die. In an embodiment, a connector of the connector structure is electrically coupled to the first device die through a first inactive structure of the one or more inactive structures. In an embodiment, the cumulative area of the second device die and the one or more inactive structures is less than 95% of the area of the first device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a first device die, the first device die comprising an active device disposed therein, the first device die having a first surface area;
bonding a second device die to the first device die, the second device die having a second surface area less than one-half the first surface area;
bonding one or more inactive structures to the first device die, the one or more inactive structures having a cumulative third surface area, the second surface area and the cumulative third surface area together being greater than one-half the first surface area;
filling a gap laterally surrounding the second device die and the one or more inactive structures with a gap-fill material;
forming a redistribution structure over the gap-fill material;
forming a connector structure over the redistribution structure; and
singulating the first device die from a wafer to form a singulated device package including the first device die, the second device die, and at least a portion of the one or more inactive structures.

2. The method of claim 1, further comprising:
forming a through-via in the gap-fill material.

3. The method of claim 1, wherein bonding a first inactive structure of the one or more inactive structures to the first device die comprises:
placing the first inactive structure on the first device die;
pressing the first inactive structure against the first device die; and
annealing the combination of the first inactive structure and the first device die.

4. The method of claim 3, wherein the first inactive structure overlaps a dicing line of the first device die and covers a portion of a third device die, the third device die adjacent the first device die.

5. The method of claim 1, wherein the singulating comprises a cutting process, wherein the cutting process cuts through a first inactive structure of the one or more inactive structures.

6. The method of claim 1, wherein bonding the second device die to the first device die comprises:
aligning second bond pads of the second device die to first bond pads of the first device die;
pressing the second bond pads to the first bond pads; and
annealing the second device die and first device die to interdiffuse a metallic material of the first bond pads with a metallic material of the second bond pads.

7. The method of claim 1, wherein the one or more inactive structures are free from an electrical coupling to the active device of the first device die.

8. The method of claim 1, wherein a first inactive structure of the one or more inactive structures further comprises a tensile film layer, a metallization layer, a bond pad, a via, or combinations thereof.

9. A method comprising:
bonding a second device die to a first device die, the first device die having a first footprint, the second device die having a second footprint less than half the first footprint, the second device die comprising a semiconductor substrate;
bonding one or more inactive structures to the first device die adjacent the second device die, the one or more inactive structures comprising a semiconductor substrate free of any active devices, wherein a first inactive structure of the one or more inactive structures comprises a semiconductor substrate and a dielectric bonding layer, wherein bonding the one or more inactive structures further comprises fusing the dielectric bonding layer to a dielectric bonding layer of the first device die;
depositing a dielectric fill material laterally surrounding the second device die and the one or more inactive structures; and
forming a connector structure over the dielectric fill material, the connector structure electrically coupled to the second device die.

10. The method of claim 9, wherein the first inactive structure further comprises a tensile film layer.

11. The method of claim 9, wherein the first inactive structure further comprises a metallization layer.

12. The method of claim 11, wherein the first inactive structure further comprises bond pads disposed in the dielectric bonding layer, wherein bonding the one or more inactive structures further comprises, bonding the bond pads to corresponding bond pads of the first device die without using a solder material.

13. The method of claim 11, wherein the first inactive structure further comprises a through-via traversing a thickness of the semiconductor substrate, the through-via configured to disperse heat from the first device die.

14. The method of claim 9, wherein the second device die and the one or more inactive structures have varying thicknesses, further comprising: leveling an upper surface of the second device die and upper surfaces of the one or more inactive structures so that they each have a same thickness.

15. The method of claim 9, further comprising cutting through the dielectric fill material and through the first device die to form a first package, wherein the cutting is through the first inactive structure so that part of the first inactive structure remains with the first package and another part of the first inactive structure remains with another package.

16. A method comprising:
bonding a second device die to a first device die;
bonding one or more inactive structures to the first device die, wherein a cumulative area of the second device die and the one or more inactive structures is greater than 50% of an area of the first device die;
depositing a dielectric layer to laterally surround the second device die and the one or more inactive structures; and
forming a connector structure disposed over the dielectric layer, the connector structure electrically coupled to the second device die, wherein a connector of the connector structure is electrically coupled to the first device die through a first inactive structure of the one or more inactive structures.

17. The method of claim 16, wherein a first inactive structure of the one or more inactive structures comprises a semiconductor substrate, a dielectric bonding layer, and one or more of: a tensile film, metal lines, bond pads disposed in the dielectric bonding layer, or through-vias disposed in the semiconductor substrate.

18. The method of claim 16, wherein a first inactive structure of the one or more inactive structures has a first sidewall aligned to a sidewall of the first device die.

19. The method of claim 16, further comprising:
singulating a workpiece containing the first device die, the singulating cutting through a first inactive structure of the one or more inactive structures so that part of the first inactive structure remains with a first package and another part of the first inactive structure remains with a second package.

20. The method of claim 16, further comprising:
forming a redistribution structure over the dielectric layer;
forming the connector structure over the redistribution structure; and
singulating the first device die from a wafer to form a singulated device package including the first device die, the second device die, and at least a portion of the one or more inactive structures.

* * * * *